(12) United States Patent
Lee et al.

(10) Patent No.: US 9,158,622 B2
(45) Date of Patent: Oct. 13, 2015

(54) STORAGE DEVICE INCLUDING NON-VOLATILE MEMORY DEVICE AND REPAIR METHOD

(71) Applicants: Joonho Lee, Hwaseong-si (KR); Jong-Nam Baek, Hwaseong-si (KR); Dong-Hoon Ham, Hwaseong-si (KR); Sang-Wook Yoo, Seongnam-si (KR); Intae Hwang, Suwon-si (KR)

(72) Inventors: Joonho Lee, Hwaseong-si (KR); Jong-Nam Baek, Hwaseong-si (KR); Dong-Hoon Ham, Hwaseong-si (KR); Sang-Wook Yoo, Seongnam-si (KR); Intae Hwang, Suwon-si (KR)

(73) Assignee: Samsung Electronics Co. Ltd., Suwon-si, Gyeonggi-do (KR)

( * ) Notice: Subject to any disclaimer, the term of this patent is extended or adjusted under 35 U.S.C. 154(b) by 196 days.

(21) Appl. No.: 13/784,874

(22) Filed: Mar. 5, 2013

(65) Prior Publication Data

US 2013/0326312 A1      Dec. 5, 2013

(30) Foreign Application Priority Data

Jun. 1, 2012   (KR) ................... 10-2012-0059357

(51) Int. Cl.

| | |
|---|---|
| G11C 29/00 | (2006.01) |
| G06F 11/10 | (2006.01) |
| G06F 11/16 | (2006.01) |
| H01L 27/115 | (2006.01) |
| G06F 12/02 | (2006.01) |
| G06F 11/14 | (2006.01) |
| G11C 16/10 | (2006.01) |
| G06F 11/20 | (2006.01) |

(52) U.S. Cl.
CPC ........ *G06F 11/1068* (2013.01); *G06F 11/1666* (2013.01); *G06F 12/0246* (2013.01); *G11C 29/808* (2013.01); *G11C 29/82* (2013.01); *H01L 27/1158* (2013.01); *G06F 11/1412* (2013.01); *G06F 11/20* (2013.01); *G06F 2212/7209* (2013.01); *G11C 16/105* (2013.01); *G11C 29/785* (2013.01)

(58) Field of Classification Search
CPC . G11C 16/105; G11C 29/785; G06F 11/1412
See application file for complete search history.

(56) References Cited

U.S. PATENT DOCUMENTS

| | | | |
|---|---|---|---|
| 7,366,825 B2 | 4/2008 | Williams et al. | |
| 7,802,152 B2 | 9/2010 | Brune et al. | |
| 7,861,139 B2 | 12/2010 | Murray et al. | |
| 8,214,698 B2 | 7/2012 | Kim et al. | |
| 8,417,869 B2 * | 4/2013 | Chen | 711/4 |
| 2008/0059835 A1 | 3/2008 | Yoon | |
| 2008/0068886 A1 | 3/2008 | Kang et al. | |
| 2008/0256524 A1 * | 10/2008 | Saraswati | 717/158 |
| 2009/0168523 A1 | 7/2009 | Shirakawa et al. | |
| 2010/0199020 A1 * | 8/2010 | Lin et al. | 711/103 |
| 2010/0306579 A1 | 12/2010 | Baek et al. | |
| 2011/0041039 A1 * | 2/2011 | Harari et al. | 714/773 |

(Continued)

FOREIGN PATENT DOCUMENTS

| | | |
|---|---|---|
| JP | 2006-018373 A | 1/2006 |
| JP | 2009-158018 A | 7/2009 |

(Continued)

*Primary Examiner* — M. Mujtaba K Chaudry
(74) *Attorney, Agent, or Firm* — Volentine & Whitt, PLLC

(57) ABSTRACT

Disclosed is a storage device which includes a nonvolatile memory device including a memory block a program order of which is adjusted regardless of an arrangement of memory cells, and a memory controller that performs address mapping to replace a bad page of the memory block with a normal page of the memory block.

18 Claims, 17 Drawing Sheets

(56) References Cited

U.S. PATENT DOCUMENTS

| | | | |
|---|---|---|---|
| 2011/0161784 A1* | 6/2011 | Selinger et al. | 714/768 |
| 2011/0214034 A1 | 9/2011 | Otsuka | |
| 2011/0271041 A1 | 11/2011 | Lee et al. | |
| 2012/0331207 A1* | 12/2012 | Lassa et al. | 711/103 |

FOREIGN PATENT DOCUMENTS

| | | |
|---|---|---|
| KR | 100755718 B1 | 8/2007 |
| KR | 10-0837274 B1 | 6/2008 |
| KR | 10-2008-0066459 A | 7/2008 |
| KR | 10-2010-0085657 A | 7/2010 |

* cited by examiner

Fig. 5

BP Repair Table 115'

BLK0

| BP Add | Repair Add |
|---|---|
| Page 2 | Page 561 |
| Page 7 | Page 562 |
| Page 125 | Page 563 |
| Page 450 | Page 564 |
| Page 552 | Page 565 |
| | |
| | |

BLK1

| BP Add | Repair Add |
|---|---|
| Page 500 | Page 561 |
| | |
| | |
| | |
| | |
| | |
| | |

BLK2

| BP Add | Repair Add |
|---|---|
| Page 121 | Page 561 |
| Page 256 | Page 562 |
| Page 511 | Page 563 |
| | |
| | |
| | |
| | |

BLK3

| BP Add | Repair Add |
|---|---|
| Page 9 | Page 561 |
| Page 165 | Page 562 |
| Page 333 | Page 563 |
| Page 480 | Page 564 |
| | |
| | |
| | |

Address → ... → Repair Address

STORAGE DEVICE INCLUDING NON-VOLATILE MEMORY DEVICE AND REPAIR METHOD

CROSS-REFERENCE TO RELATED APPLICATIONS

A claim for priority under 35 U.S.C. §119 is made to Korean Patent Application No. 10-2012-0059357 filed Jun. 1, 2012, the subject matter of which is hereby incorporated by reference.

BACKGROUND

The inventive concept relates generally to semiconductor memory devices, and more particularly, to storage devices including non-volatile memory device(s) and repair methods for same.

Semiconductor memory devices may be volatile or non-volatile in their operative natures. Volatile semiconductor memory devices may perform read and write operations at relatively high speed, but stored data is lost when power is interrupted. Nonvolatile semiconductor memory devices are able to retain stored data in the absence of applied power.

Nonvolatile semiconductor memory devices include, for example, mask read-only memory (MROM), programmable ROM (PROM), erasable programmable ROM (EPROM), electrically erasable programmable ROM (EEPROM), and the like. Flash memory is a type of EEPROM, and has been widely adopted for use in many applications. For example, flash memory is commonly used to store voice and image data in information appliances such as computers, cellular phones, PDAs, digital cameras, camcorders, voice recorders, MP3 players, handheld PCs, game machines, facsimiles, scanners, printers, and the like.

More recently, a great deal of research has been expended in the development of contemporary nonvolatile memory devices including a stacked or three-dimensional (3D) memory cell array.

SUMMARY

One aspect of embodiments of the inventive concept is directed to provide a storage device comprising a nonvolatile memory device including a memory block a program order of which is adjusted regardless of an arrangement of memory cells; and a memory controller controlling the nonvolatile memory device and performing address mapping to replace a bad page of the memory block with a normal page of the memory block.

Another aspect of embodiments of the inventive concept is directed to provide a storage device comprising a nonvolatile memory device including memory blocks each having a variable program order regardless of an arrangement of memory cells; and a memory controller controlling the nonvolatile memory device and performing address mapping to replace a bad page of a first memory block of the memory blocks with a normal page of a second memory block of the memory blocks, wherein normal pages of the first memory block are accessed according to page addresses provided from the memory controller.

Still another aspect of embodiments of the inventive concept is directed to provide a repair method of a nonvolatile memory device which includes a memory block in which a plurality of word lines is stacked in a direction perpendicular to a substrate. The repair method comprises determining whether an input page address corresponds to a bad page located at a main area of the memory block; and mapping an address of the bad page onto an address of a normal page of a reserved area of the memory block according to the determination result.

BRIEF DESCRIPTION OF THE DRAWINGS

The above and other objects and features will become apparent from the following description with reference to the following figures, wherein like reference numerals refer to like parts throughout the various figures unless otherwise specified, and wherein

FIG. 5 is a conceptual diagram illustrating a bad page repair table according to an embodiment of the inventive concept.

DETAILED DESCRIPTION

Figure 1:
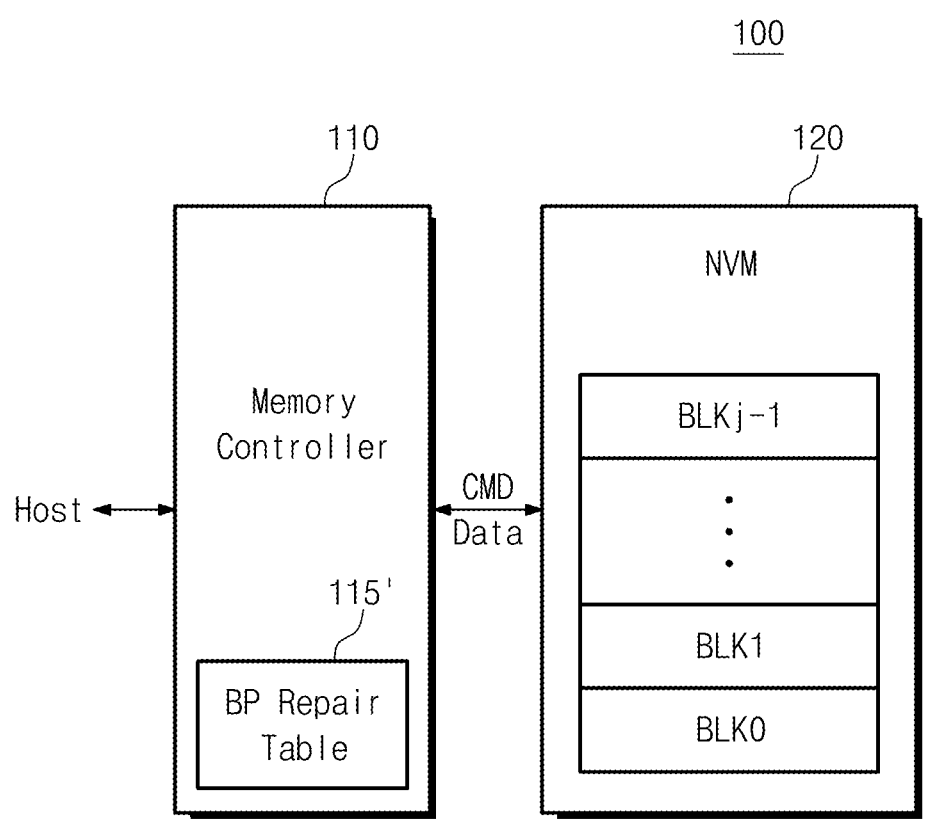
FIG. 1 is a block diagram illustrating a storage device according to an embodiment of the inventive concept.

Embodiments of the inventive concept will now be described in some additional detail with reference to the accompanying drawings. The inventive concept, however, may be embodied in various different forms, and should not be construed as being limited to only the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Certain flash memory device according to embodiment(s) of the inventive concept and certain read operations related to these devices will be described hereafter as examples of a broader class of nonvolatile semiconductor memory devices. Those skilled in the art will recognize that the exemplary flash memory devices and read operations may be varied or modified within the scope of the inventive concept.

Below, features and functions of the inventive concept will be exemplarily described using a flash memory device as a nonvolatile storage medium. However, the inventive concept is not limited thereto. Further, other nonvolatile memory devices may be used as a storage medium. For example, the storage medium may be formed of a PRAM, an MRAM, a ReRAM, a FRAM, a NOR flash memory, or the like. The storage medium may also be applied to a memory system including different types of memory devices.

The inventive concept may be implemented by different embodiments or applied thereto. Further, detailed description may be modified or changed according to viewpoints and applications without escaping from the scope, spirit and other objects of the inventive concept. Below, the inventive concept will be described with reference to accompanying drawings.

FIG. 1 is a block diagram illustrating a storage device according to an embodiment of the inventive concept. Referring to FIG. 1, a storage device 100 generally comprises a memory controller 110 and a nonvolatile memory device 120.

The memory controller 110 is configured to control the nonvolatile memory device 120 in response to requests received from a host (not shown). Hence, the memory controller 110 is usually configured to interface with the host as well as the nonvolatile memory device 120. As will be conventionally appreciated, the nonvolatile memory device 120 may execute (or "perform") erase, read, and/or write operations under the control of the memory controller 110. Thus, the memory controller 110 controls execution of a write operation by the nonvolatile memory device 120 in response to a write request received from the host, and controls execution of a read operation by the nonvolatile memory device 120 in response to a read request received from the host.

As is conventionally understood, it is very difficult, if not practically impossible, to commercially fabricate perfect memory cell arrays. At least a relatively few of the billions of individual memory cells forming contemporary memory cell arrays will be defective. Accordingly, the memory controller 110 will include a bad page (hereafter, "BP") repair table 115'. The BP repair table 115' may be used to essentially "remap" address(es) corresponding to a bad page (i.e., a defined page of memory cells including at least one defective memory cell) of the nonvolatile memory device 120 onto address(es) for a normal page (hereinafter, "NP") designated for use as a repair page.

Thus, the BP repair table 115' may be used to store addresses of bad pages for one or more memory block(s) of the nonvolatile memory device 120. In this manner, the BP repair table 115' may be used to store mapping information between each bad page and a corresponding repair page (hereinafter, "RP"). In certain embodiments, bad pages and corresponding repair pages may be tracked (or accounted for) by the BP repair table 115' on a memory block by memory block basis. Alternatively, bad pages and corresponding repair pages may be tracked by the BP repair table 115' across a number of different memory blocks.

The memory controller 110 may include a flash translation layer (hereinafter, "FTL"). As is conventionally appreciated, a FTL may be used to operationally mask an erase operation executed by the nonvolatile memory device 120 from a host-based file system. Thus, a FTL may be used to compensate for certain drawbacks inherent in the operating characteristics of the nonvolatile memory device 120, such as an erase-before-write requirement, a mismatch between an erase operation unit size and a write operation unit, etc. During write operations executed by the nonvolatile memory device 120, the FTL may be used to map logical address(es) generated by the file system onto corresponding physical address(es) of the nonvolatile memory device 120.

Within certain embodiments of the inventive concept, the memory controller 110 may be used to perform not only logical/physical address mapping, but also mapping related to the repair of bad pages, bad word lines, etc. As a result, the defects practically arising during the fabrication of the nonvolatile memory device 120 may effectively be repaired by various address mapping or address remapping functions performed by the memory controller 110.

As has been suggested above and as will be conventionally appreciated, the nonvolatile memory device 120 may include a memory cell array logically divided into a plurality of memory blocks, wherein each memory block includes an arrangement of memory cells connected in rows and columns. Each individual memory cell may be used to store single level (or single-bit) data, or multi-level (or, multi-bit) data. Further, the constituent memory cell array of the nonvolatile memory device 120 may have a two-dimensional (2D) structure or a 3D (or stacked, or vertical) structure.

In the illustrated embodiment of FIG. 1, the nonvolatile memory device 120 is assumed to include a plurality of memory blocks BLK0 to BLKj−1, each of which corresponds to an erase unit. Each of the memory blocks BLK0 to BLKj−1 may include a plurality of memory cells that are stacked in a direction intersecting a substrate to form respective cell strings. Alternatively, each of the memory blocks BLK0 to BLKj−1 may be configured such that a plurality of cell strings are stacked in a direction parallel with the substrate. However, 3D array structures enable a dramatic expansion of data storage capacity for each of the plurality of memory blocks BLK0 to BLKj−1. And while this dramatic expansion of data storage capacity has notable benefits, it also has certain drawbacks as will be explained hereafter.

In particular, the "program order" (i.e., a defined sequence—e.g., a page sequence—according to which constituent memory cells are programmed) for a memory block of the nonvolatile memory device 120 may not be fixed to perform a repair operation according to a page unit. That is, the program order of the nonvolatile memory device 120 may not be rationally defined in view of the actual arrangement order of word lines and/or string selection lines of a 3D memory cell array.

In the nonvolatile memory device 120, a new page or word line must be freely accessible regardless of the relative location of a previously programmed page, as defined by the program order. Thus, the program order may be flexibly varied regardless of the arrangement of word lines in a selected memory block and regardless of the arrangement order of string selection lines. Accordingly, it is possible to perform a repair operation by a page unit basis by controlling the nonvolatile memory device 120 having the above-described structure.

If, however, the repair operation is performed by a block unit basis, the corresponding cost of discarding an entire bad block will be excessively high. Thus, the memory controller 110 should manage repair operations on a word line basis or on a page unit basis to provide high repair efficiency.

As one example, a NAND flash memory cell array will be assumed as the storage medium for the nonvolatile memory device 120. However, the inventive concept is not limited thereto. For example, a PRAM, an MRAM, a ReRAM, a FRAM, or a NOR flash memory may be used as the storage medium. Also, the inventive concept may be applied to a memory system in which different types of memory devices are used together. In particular, the inventive concept may be applied to a storage device, such as a solid state drive (hereinafter, referred to as an SSD). In this case, the memory controller 110 may be configured to communicate with a host through one of various interface protocols, such as USB, MMC, PCI-E, SATA, PATA, IDE, E-IDE, SCSI, ESDI, SAS, and so on.

Figure 2:
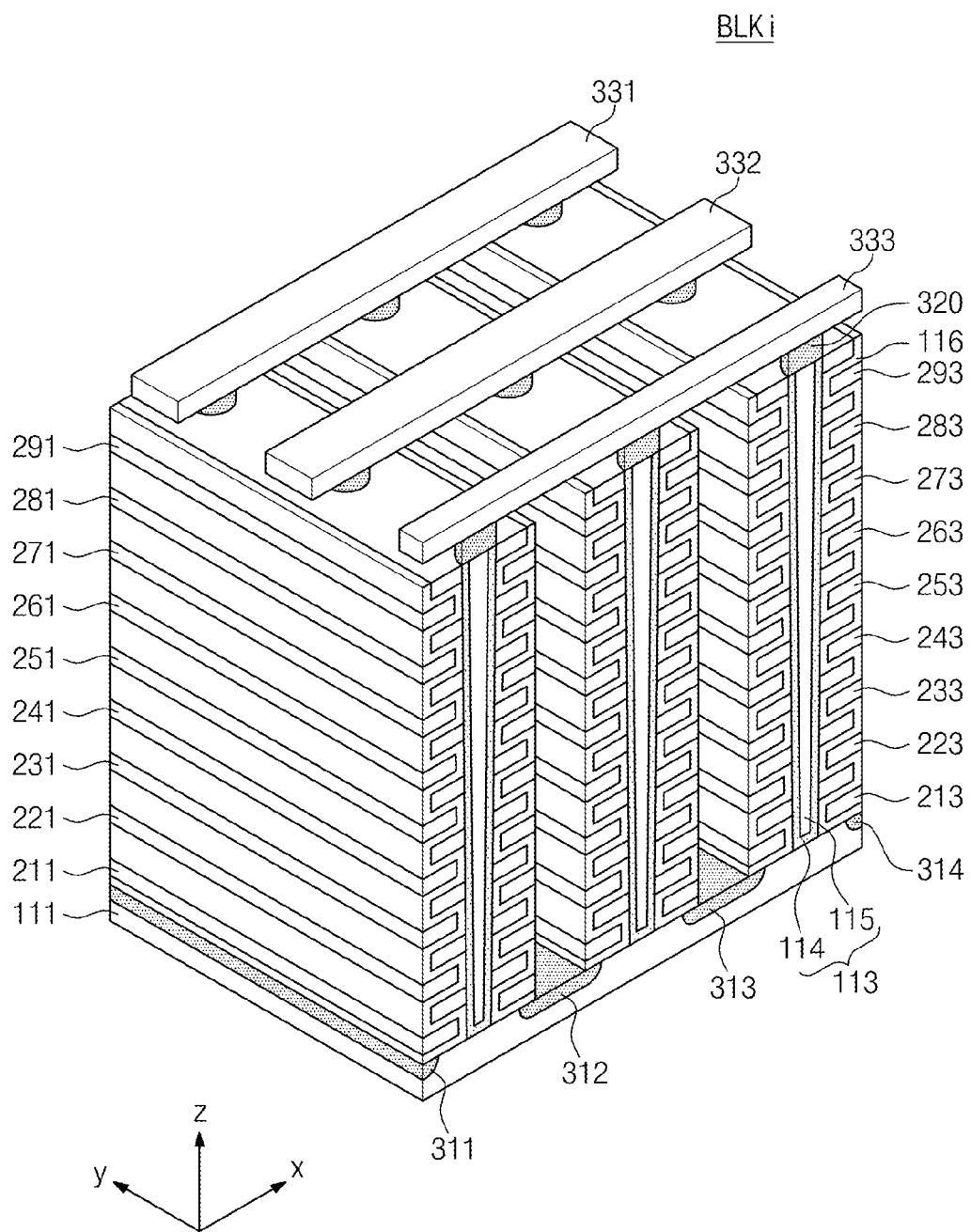
FIG. 2 is a perspective view illustrating one of memory blocks in FIG. 1.

FIG. 2 is a perspective view further illustrating the memory block BLKi of FIG. 1. Referring to FIG. 2, the memory block BLKi includes structures extending in three mutually orthogonal directions arbitrarily designated "x", "y", and "z".

A substrate 111 may be provided to form the memory block BLKi. The substrate 111 may be formed of a p-well in which boron is injected, for example. Alternatively, the substrate 111 may be a pocket p-well provided within an n-well. Below, it is assumed that the substrate 111 is a p-well. However, the substrate 111 is not limited to a p-well.

A plurality of doping regions 311 to 314 extending along the direction x may be provided in the substrate 111. For example, the plurality of doping regions 311 to 314 may be formed of n-type conductors different from that of the substrate 111. Below, it is assumed that first to third doping regions 311 to 314 are n-type. However, the first to third doping regions 311 to 314 are not limited to the n-type.

On the substrate 111 between the first and second doping regions 311 and 312, a plurality of insulation materials 112 extending along the y-direction may be provided sequentially along the z-direction. The insulation materials 112 may be formed to be spaced apart along the z-direction. For example, the insulation materials may include an insulation material such as silicon oxide.

On the substrate 111 between the first and second doping regions 311 and 312, a plurality of pillars 113 may be arranged sequentially along the y-direction so as to penetrate the plurality of insulation materials 112 along the z-direction. For example, the pillars 113 may contact with the substrate 111 through the insulation materials 112. Herein, the pillar 113 may also be formed on the substrate between third and fourth doping regions 313 and 314 and on the substrate 111 between the second and third doping regions 312 and 313.

In certain embodiments, each pillar 113 may be formed of a plurality of materials. For example, a surface layer 114 of each pillar 113 may include a first type of silicon material. For example, the surface layer 114 of each pillar 113 may include a silicon material having the same type as the substrate 111. Below, it is assumed that the surface layer 114 of each pillar 113 includes p-type silicon. However, the surface layer 114 of each pillar 113 is not limited to the p-type silicon.

An inner layer 115 of each pillar 113 may be formed of an insulation material. For example, the inner layer 115 of each pillar 113 may include an insulation material such as silicon oxide. For example, the inner layer 115 of each pillar 113 may include air gap.

An insulation film 116 may be provided between the first and second doping regions 311 and 312 along exposed surfaces of the insulation materials 112, the pillars 113, and the substrate 111. In example embodiments, the insulation film 116 can be removed which is provided on an exposed surface (toward the third direction z) of the last insulation material 112 provided along the z-direction.

At a region between the first and second doping regions 311 and 312, first conductive materials 211 to 291 may be provided on an exposed surface of the insulation film 116, respectively. For example, the first conductive material 211 extending along the y-direction may be provided between the substrate 111 and the insulation material 112 adjacent to the substrate 111. In detail, the first conductive material 211 extending in the x-direction may be provided between the substrate 111 and the insulation film 116 of a lower surface of the insulation material 112 adjacent to the substrate 111.

The first conductive material extending along the y-direction may be provided between the insulation film 116 on an upper surface of a specific insulation material of the insulation materials 112 and the insulation film 116 on a lower surface of an insulation material disposed at an upper portion of the specific insulation material. In example embodiments, the first conductive materials 221 to 281 extending in the y-direction may be provided between the insulation materials 112, respectively. In example embodiments, each of the first conductive materials 211 to 291 may include a metal material. For example, each of the first conductive materials 211 to 291 may include a conductive material such as polysilicon.

The same structure as that on the first and second doping regions 311 and 312 may be provided between the second and third doping regions 312 and 313. For example, between the second and third doping regions 312 and 313, there may be provided a plurality of insulation materials 112 extending in the y-direction, a plurality of pillars 113 disposed sequentially along the y-direction so as to penetrate the insulation materials 112 along the x-direction, an insulation film 116 provided on exposed surfaces of the plurality of pillars 113 and the plurality of insulation materials 112, and a plurality of first conductive materials 212 to 292 extending along the y-direction.

The same structure as that on the first and second doping regions 311 and 312 may be provided between the third and fourth doping regions 313 and 314. For example, between the third and fourth doping regions 313 and 314, there may be provided a plurality of insulation materials 112 extending in the y-direction, a plurality of pillars 113 disposed sequentially along the y-direction so as to penetrate the insulation materials 112 along the z-direction, an insulation film 116 provided on exposed surfaces of the plurality of pillars 113 and the plurality of insulation materials 112, and a plurality of conductive materials 213 to 293 extending along the y-direction.

Drains 320 may be provided on the pillars 113, respectively. The drains 320 may be second-type silicon materials. For example, the drains 320 may be n-type silicon materials. Below, it is assumed that the drains 320 include n-type silicon materials. However, the drains 320 are not limited to include n-type silicon materials. A width of each drain 320 may be wider than that of a corresponding pillar 113. Each drain 320 may be provided on an upper surface of a corresponding pillar 113 in a pad shape, for example.

Conductive materials 331 to 333 extending along the x-direction may be provided on the drains 320, respectively. The conductive materials 331 to 333 may be disposed sequentially along the y-direction. The conductive materials 331 to 333 may be connected with corresponding drains 320, respectively. For example, the drains 320 and the conductive material 333 extending along the x-direction may be connected via contact plugs, respectively. Each of the conductive materials 331 to 333 may be a metallic material. In example embodiments, each of the conductive materials 331 to 333 may be a conductive material such as polysilicon.

Figure 3:
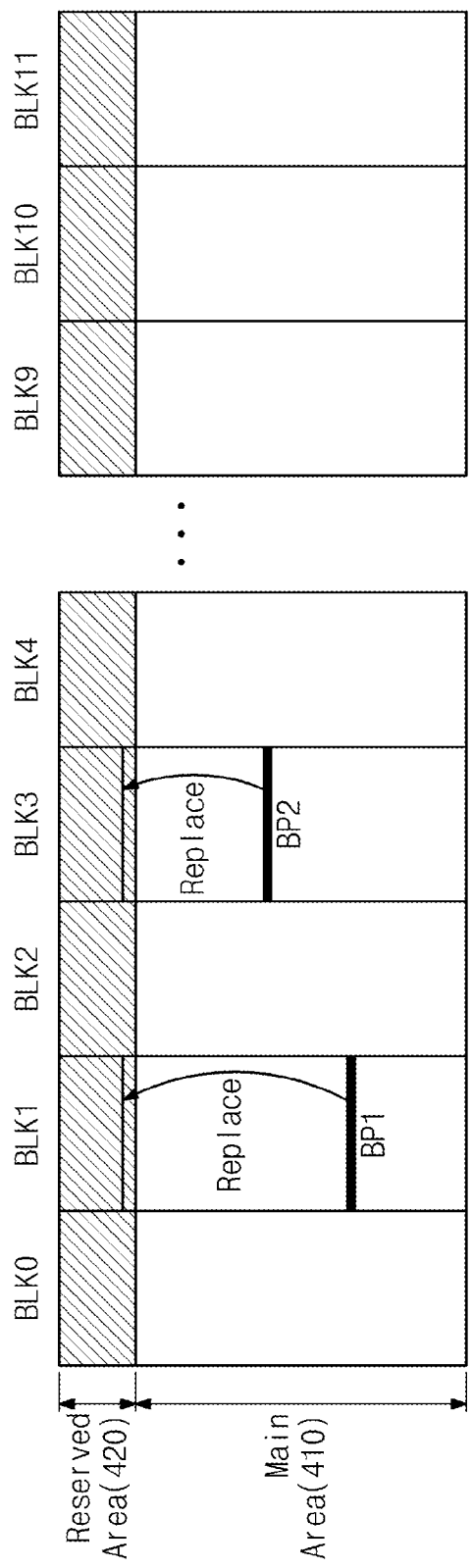
FIG. 3 is a conceptual diagram illustrating a repair method according to an embodiment of the inventive concept.

FIG. 3 is a conceptual diagram illustrating a repair method according to an embodiment of the inventive concept. Referring to FIG. 3, each of memory blocks BLK0 to BLK11 of a nonvolatile memory device 120 is assumed to include a designated "main area" 410 and a designated "reserved area" 420.

The main areas of the memory blocks BLK0 to BLK11 will be used as data storage areas that are operationally visible by a "user" (e.g., a constituent memory system and/or a connected host). In contrast, the reserved areas 420 of the memory blocks BLK0 to BLK11 will be used as data storage areas that are not operationally visible to a user. As a result, if a bad page BP is identified in a main area 410, it may be functionally "replaced" with a repair page RP located in a corresponding reserved area 420. Replacement of the bad page BP may be performed using a repair table like BP repair table 115' of FIG. 1 provided by the memory controller 110. Once replaced, access to the bad page BP may be blocked, and instead, the designated repair page located in the reserved area 420 of the same memory block including the bad page BP may be accessed.

In the illustrated example of FIG. 3, it is assumed that the main areas 410 of the memory blocks BLK1 and BLK3 include bad pages BP1 and BP2, respectively. Addresses corresponding to the bad pages BP1 and BP2 may be detected during various testing conducted at the level or process stages of fabrication. The addresses of the detected bad pages BP1 and BP2 may be stored at the nonvolatile memory device 120 using a fuse program operation and/or an initialization process. The addresses of the bad pages BP1 and BP2 may be loaded onto the BP repair table 115' when the nonvolatile memory device 120 is powered up. Afterwards, if addresses corresponding to the bad pages BP1 and BP2 are received from an external device, the memory controller 110 will instead access repair pages corresponding to the bad pages BP1 and BP2 based on the BP repair table 115'.

Within certain embodiments of the inventive concept, each bad page BP of a main area 410 will be replaced with a corresponding repair page RP of the reserved area 420 in the "same memory block" (i.e., the same memory block including the bad page.

Figure 4:
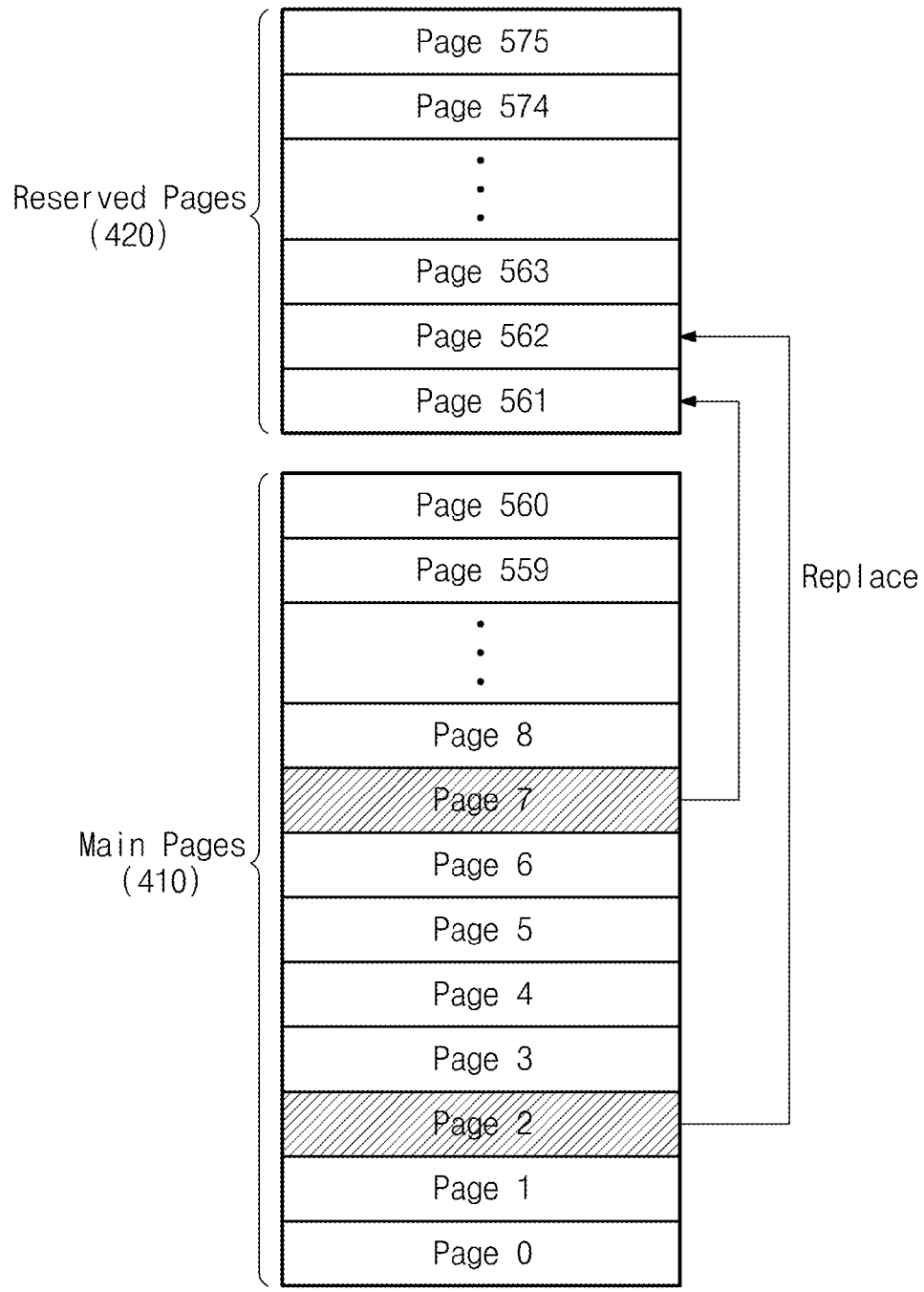
FIG. 4 is a conceptual diagram illustrating a repair method on a memory block in FIG. 3.

FIG. 4 is a diagram further illustrating the repair method of FIG. 3. Referring to FIG. 4, the memory block BLKi is assumed to include a main area 410 and a reserved area 420. In the illustrated example, the main area 410 includes 561 pages. Page addresses for the main area 410 correspond to page 0 to page 560, respectively. The reserved area 420 includes 15 pages. Page addresses for the reserved area 420 correspond to page 561 to page 575, respectively.

Extending the working example of FIG. 3, it is assumed that the main area 410 of the memory block BLKi includes two (2) bad pages; page 2 and page 7. Repair information associated with these bad pages may be loaded to the BP repair table 115'. If an address provided by an external device indicates one of the bad pages 2 or 7, repair (replacement) pages of the reserved area 420 will be accessed instead.

In a case where a current operation is directed to (i.e., "selects") the memory block BLKi and an input address corresponds to the bad page 2, the memory controller 110 will, in response, generate a repair address based on the BP repair table 115'. In such a case, while access to bad page 2 is blocked, a corresponding repair page 562 is accessed instead. Likewise, if access to bad page 7 is requested, a corresponding repair page 561 is accessed instead.

In certain embodiments, the size of the reserved area 420 may be determined in view of the probability of bad pages being present in a corresponding main area 410. For example, the size of the reserved area 420 may be determined in view of a defined design margin and a statistically expected number of bad pages of a memory block.

FIG. 5 is a conceptual diagram further illustrating a bad page repair table according to an embodiment of the inventive concept. Referring to FIGS. 1 and 5, the BP repair table 115' is further illustrated and shows a correlation between bad page BP addresses and repair page RP addresses in each one of a plurality of memory blocks.

Bad pages in the memory block BLK0 include page 2, page 7, page 125, page 450, and page 552. The page addresses for page 2, page 7, page 125, page 450, and page 552 of bad pages may belong to a main area 410. Repair pages of a reserved area 420 to repair the bad pages may have page addresses page 561, page 562, page 563, page 564, and page 565, respectively. The addresses of the bad pages page 2, page 7, page 125, page 450, and page 552 may be discontinuous. On the other hand, the addresses of the repair pages page 561, page 562, page 563, page 564, and page 565 may be continuous. Nonetheless, it is possible to manage page addresses of repair pages randomly, and in memory management it is often advantageous to replace bad pages sequentially from a low address number.

Bad pages for the memory block BLK1 include only page 500. A repair page of the reserved area 420 to repair the bad page may have a page address page 561. Thus, the main area 410 of the memory block BLK1 includes only one bad page. In this case, one repair page may be used to replace the bad page.

Of note, it is also possible that a specific memory block may not include any bad pages. In such circumstances, the BP repair table 115' will not include information associated with the specific memory block being a defect-free memory block.

In memory blocks BLK2 to BLK11, address mapping may be made such that repair pages of the reserved area 420 replace bad pages in the above-described manner. Each memory block may be repaired by a page unit by managing the BP repair table 115'. Thus, it is possible to prevent an entire memory block from being discarded as a bad block due to defects present in as few as one bad page or word line.

Figure 6:
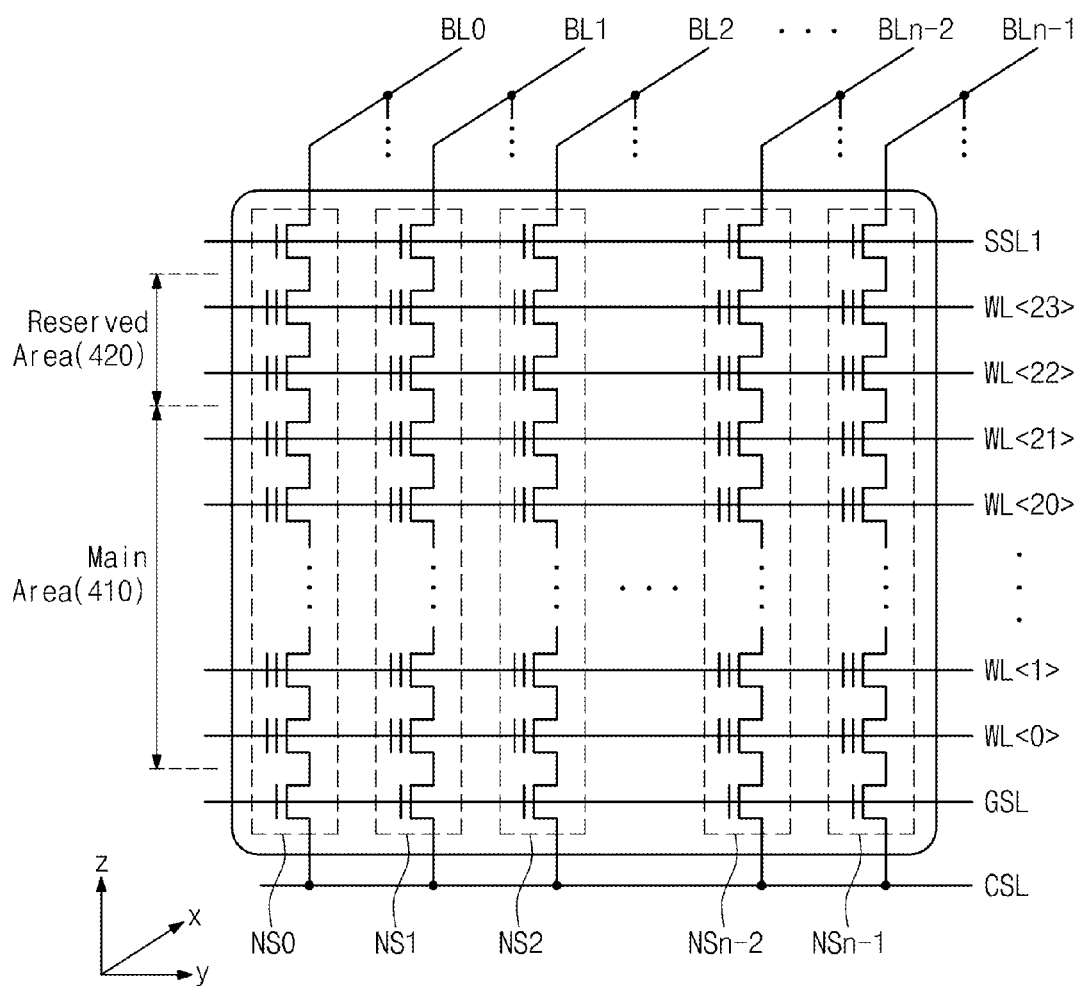
FIG. 6 is a partial circuit diagram further illustrating a reserved area according to an embodiment of the inventive concept.

FIG. 6 is a partial circuit diagram further illustrating a reserved area according to an embodiment of the inventive concept. Referring to FIG. 6, there are illustrated NAND cell strings connected with one string selection line SSL1. Although not shown, a plurality of string selection lines SSL2 to SSL7 and NAND cell strings connected with the string selection lines SSL2 to SSL7 may be provided along an x-direction. NAND cell strings connected with the string selection lines SSL2 to SSL7 may be configured the same as NAND strings NS0 to NS$n-1$ connected with the string selection line SSL1.

In certain embodiments, the main area 410 and reserved area 420 may be determined on the basis of word line(s). For example, the main area 410 may be formed of memory cells connected with word lines WL<0> to WL<21>. The reserved area 420 may be formed of memory cells connected with word lines WL<22> and WL<23>. If eight string selection lines are connected with a memory block, division into the main and reserved areas 410 and 420 may be identically applied to NAND cell strings connected with respective string selection lines SSL2 to SSL7. Each memory cell can be formed of a multi-level cell.

Although the reserved area 420 is determined on the basis of word lines, bad pages need not be required by a word line unit. For example, in case that a memory block is formed of multi-level cells, logical pages may be repaired independently. This will be described in some additional detail hereafter.

Figure 7:
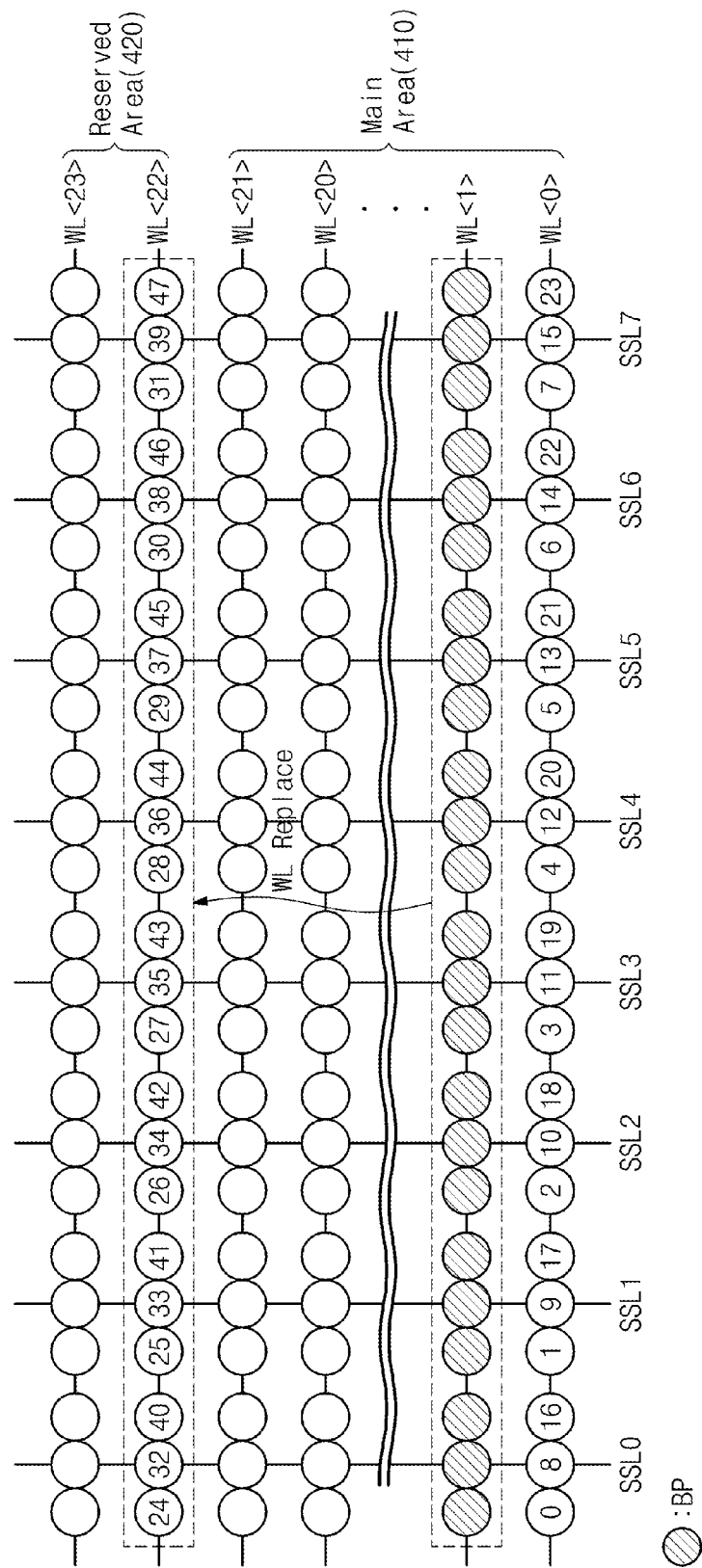
FIG. 7 is a diagram illustrating an embodiment that a memory block in FIG. 6 is repaired by a word line unit.

FIG. 7 is a diagram illustrating an embodiment wherein a memory block of FIG. 6 is repaired using a word line unit. Referring to FIG. 7, memory cells connected with a word line in a main area 410 may be replaced with memory cells connected with a word line in a reserved area 420.

Memory cells may be arranged at intersections of string selection lines SSL0 to SSL7 and word lines, respectively. Although not shown in FIG. 7, such a structure may be repeated with respect to respective bit lines. It is assumed that each memory cell is a multi-level cell capable of storing 3-bit data. In this case, three circles at respective intersections may indicate data bits corresponding to one page, respectively. For example, circles marked by 0 to 7 may form a page that is capable of being programmed in a memory block.

In the illustrated embodiment of FIG. 7, memory cells connected with a word line WL<1> of the main area 410 may be replaced with memory cells connected with a word line WL<22> of the reserved area 420. For example, one memory cell may be replaced with one memory cell. Since a plurality of data bits is stored at one memory cell, a repair operation may be performed according to a unit including a number of pages.

Herein, a program order may be randomly selected regardless of an arrangement order of word lines or string selection lines. For convenience of description, however, a technical description will be given that assumes a program operation being executed according to a unit of word lines.

First, the Least Significant Bits (LSBs) of the memory cells connected with a word line WL<0> are programmed. An LSB page 0 formed by memory cells connected with the word line WL<0> and a string selection line SSL0 are programmed. Then, an LSB page 1 formed by memory cells connected with the word line WL<0> and a string selection line SSL1 are programmed. An LSB page 2 formed by memory cells connected with the word line WL<0> and a string selection line SSL2 are programmed. An LSB page 3 formed by memory cells connected with the word line WL<0> and a string selection line SSL3 are programmed. An LSB page 4 formed by memory cells connected with the word line WL<0> and a string selection line SSL4 are programmed. An LSB page 5 formed by memory cells connected with the word line WL<0> and a string selection line SSL5 are programmed. An LSB page 6 formed by memory cells connected with the word line WL<0> and a string selection line SSL6 are programmed. An LSB page 7 formed by memory cells connected with the word line WL<0> and a string selection line SSL7 are programmed. LSB pages formed of memory cells connected with the word line WL<0> may be programmed in the above-described manner.

Central Significant Bit (CSB) pages formed of memory cells connected with the word line WL<0> are then programmed. Programming of the CSB pages may be performed according to an arrangement order of string selection lines SSL0 to SSL7. Most Significant Bit (MSB) pages formed of memory cells connected with the word line WL<0> are then programmed. Programming of the MSB pages may be performed according to an arrangement order of string selection lines SSL0 to SSL7. Programming of memory cells connected with the word line WL<0> may be completed when the MSB page 23 formed of memory cells connected with the string selection line SSL7 is programmed. Memory cells connected with one word line may be programmed in the above-described manner.

However, since a word line WL<1> is a bad word line, it was replaced with a word line WL<22>. During access operations directed to pages corresponding to the word line WL<1>, the word line WL<22> must instead be accessed under the control of a memory controller 110. LSB pages page 24 to page 31, CSB pages page 32 to page 39, and MSB pages page 40 to page 47 formed of memory cells connected with the word line WL<22> instead of the word line WL<1> may be programmed.

A case wherein pages have been replaced according to a word line unit have been described. However, a program order may be changed freely according to an input address, and need not be fixed.

Figure 8:
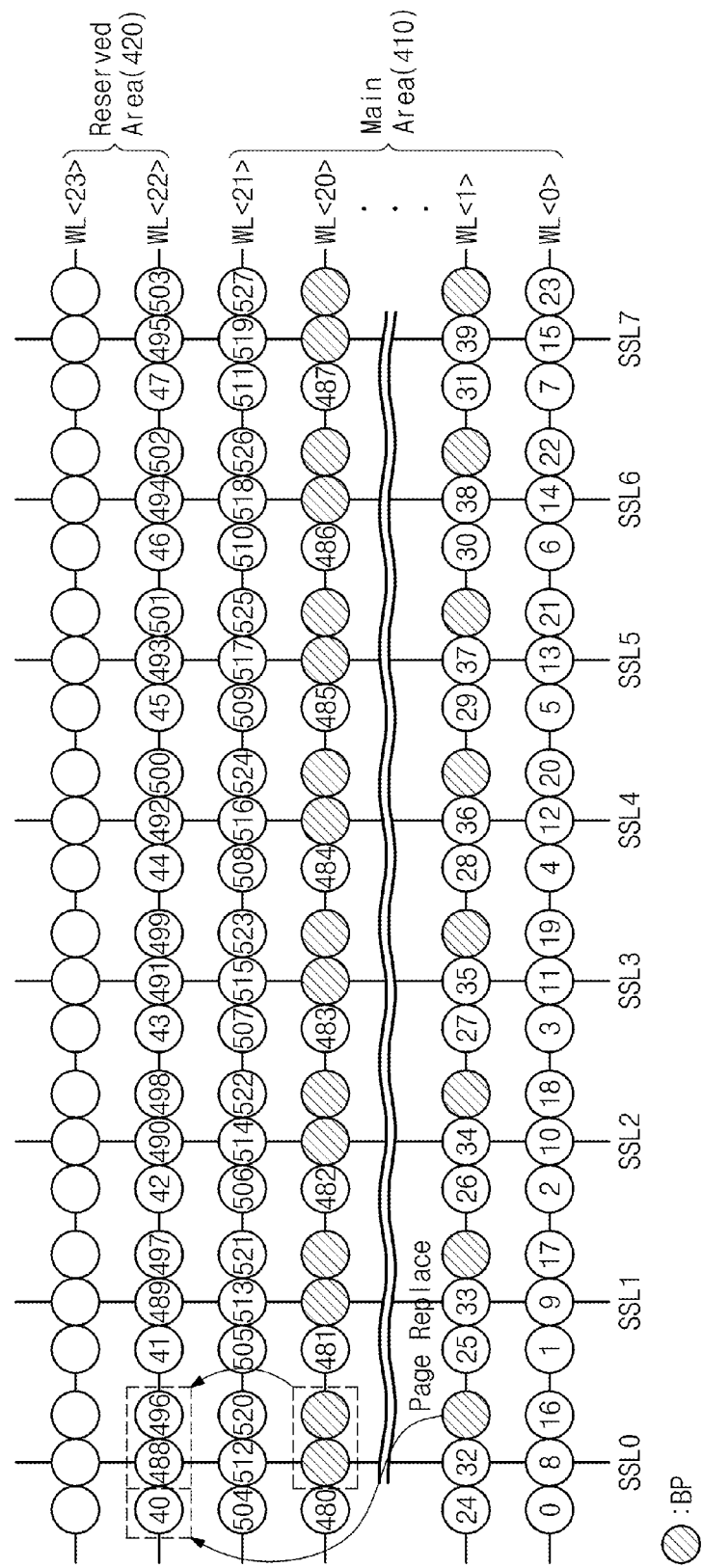
FIG. 8 is a diagram illustrating an embodiment that a memory block is repaired by a page unit.

FIG. 8 is a diagram illustrating an embodiment of the inventive concept wherein a memory block is repaired according to a page unit. Referring to FIG. 8, a main area 410 and a reserved area 420 are configured to allow defective memory cell replacement on a page unit basis. In this particular example, the arrangement of memory cells is assumed to be the same as that previously described in relation to FIG. 6, and only material difference will be described here in detail.

Given this assumed configuration, a logical page (e.g., an MSB page) formed of memory cells connected to a word line WL<1> of the main area 410 may be replaced with a logical page (e.g., an LSB page) formed of memory cells connected with a word line WL<22> of the reserved area 420. For example, at an access to page addresses page 40 to page 47, an LSB page of the word line WL<22> may be selected. In other words, a logical page of the main area 410 may be replaced with a corresponding logical page of the reserved area 420. In general, an MSB page may necessitate a finer control mechanism for programming and reading as compared with an LSB page. The reliability of the MSB page may this be rapidly reduced as compared with that of a LSB page or a CSB page. Accordingly, a repair operation designed to operate on a logical page unit basis may provide better performance than a repair operation designed to operate on a word line unit basis.

In addition, a logical page (e.g., a CSB or MSB page) formed of memory cells connected with a word line WL<20> of the main area 410 may be replaced with a logical page (e.g., an LSB page) formed of memory cells connected with a word line WL<22> of the reserved area 420. For example, at an access to page addresses page 488 to page 495, a CSB page of the word line WL<22> may be selected. At an access to page addresses page 496 to page 503, an MSB page of the word line WL<22> may be selected.

In other embodiments of the inventive concept, two or more logical pages of the main area 410 may be replaced with two or more logical pages of the reserved area 420. In cases where the reliability of a CSB page is relatively low, the reliability on an MSB page associated with the CSB page may also be low. Hence, a repair operation designed to operate on the basis of multiple logical pages may provide better performance than a repair operation designed to operate on a word line unit basis, or a single logical page basis.

Figure 9:
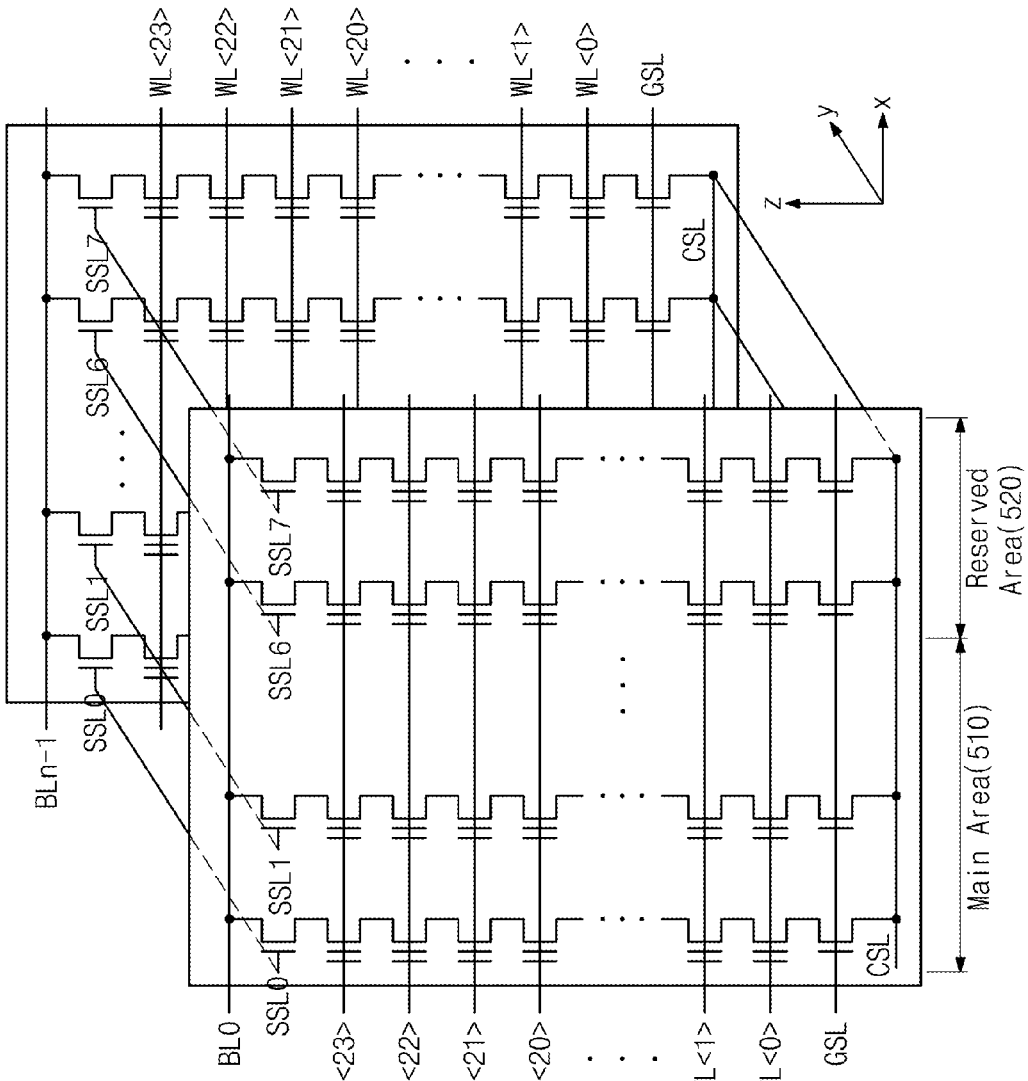
FIG. 9 is a partial circuit diagram further illustrating a reserved area according to another embodiment of the inventive concept.

FIG. 9 is a partial circuit diagram further illustrating a reserved area according to another embodiment of the inventive concept. Referring to FIG. 9, NAND cell strings are connected with bit lines BL0 to BLn−1 extending along an arbitrarily defined x-direction. NAND cell strings connected with string selection lines SSL0 to SSL5 may form a main area 510, and NAND cell strings connected with string selection lines SSL6 and SSL7 form a reserved area 520.

In cases wherein the reserved area is configured as shown in FIG. 9, a repair page may be assigned to memory cells connected with the same word line as a bad page. In memory cells connected with the string selection line SSL0, a bad page connected with a word line WL<20> may be replaced with a page which is connected with the string selection line SSL6 and corresponds to the word line WL<20>. If correspondence on page addresses is changed, a bad page can be replaced with a page corresponding to a different word line.

Figure 10:
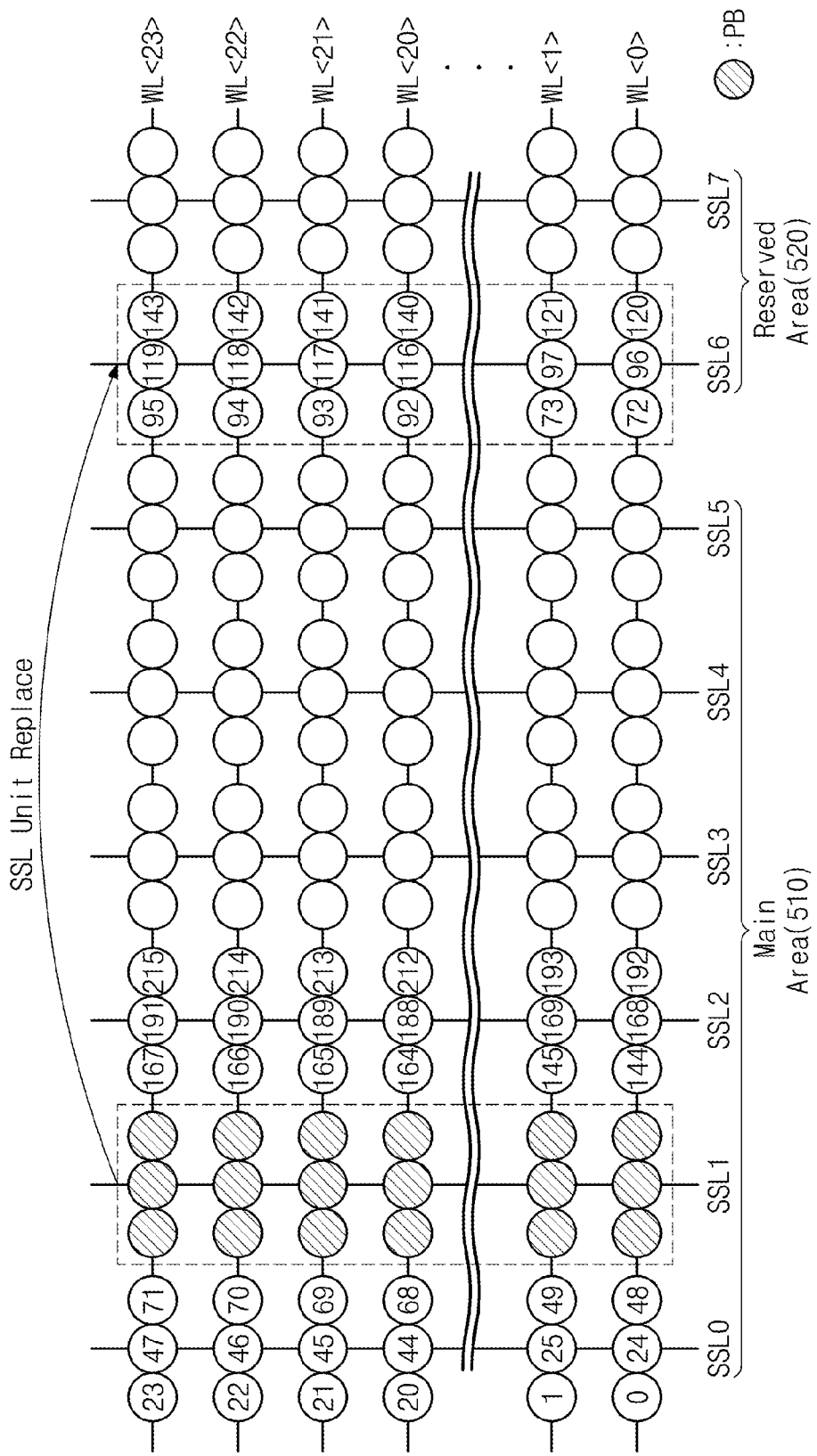
FIG. 10 is a diagram illustrating an embodiment that a memory block is repaired by a string selection line unit.

FIG. 10 is a conceptual diagram illustrating an embodiment of the inventive concept wherein a memory block is repaired using a string selection line unit basis. Referring to FIG. 10, memory cells connected with a string selection line of a main area 510 may be replaced with memory cells connected with a string selection line of a reserved area 520.

Intersections of string selection lines SSL0 to SSL7 and word lines WL<0> to WL<23> may correspond to memory cells, respectively. This structure may be identically applied to bit lines BL0 to BLn−1. It is assumed that each memory cell is formed of a multi-level cell capable of storing 3-bit data. Three circles placed at each intersection may correspond to bits of corresponding logical pages, respectively. One circle may be a storage area corresponding to a page which is stored at a memory block. Addresses may be arranged sequentially by page unit. However, the inventive concept is not limited thereto. In the illustrated embodiment, a program order may be determined regardless of an arrangement order of word lines or string selection lines.

Memory cells connected with a string selection line SSL1 of a main area 510 may be replaced with memory cells connected with a string selection line SSL6 of a reserved area 520. For example, one memory cell may be replaced with one memory cell by a string selection line unit. Since a plurality of data bits is stored at each memory cell, a repair operation may be performed using a plurality of pages as a unit basis.

If an access to a page associated with a string selection line SSL1 in a repaired memory block is requested, pages associated with a replaced string selection line SSL6 may be accessed. For example, LSB pages page 72 to page 95, CSB pages page 96 to page 119, and MSB pages page 120 to page 143 formed of memory cells connected with the string selection lines SSL1 may be replaced with pages formed of memory cells connected with the string selection line SSL6. Various types of defects may be generated at a large-capacity memory block (e.g., a three-dimensional memory block). If one or more defect(s) associated with a string selection line is generated, a repair operation may be performed by a string selection line unit. The embodiment illustrated in FIG. 10 is a case wherein a repair operation is performed on a string selection line unit basis. However, an analogous repair operation may be performed using a plurality of string selection lines as a unit basis.

Figure 11:
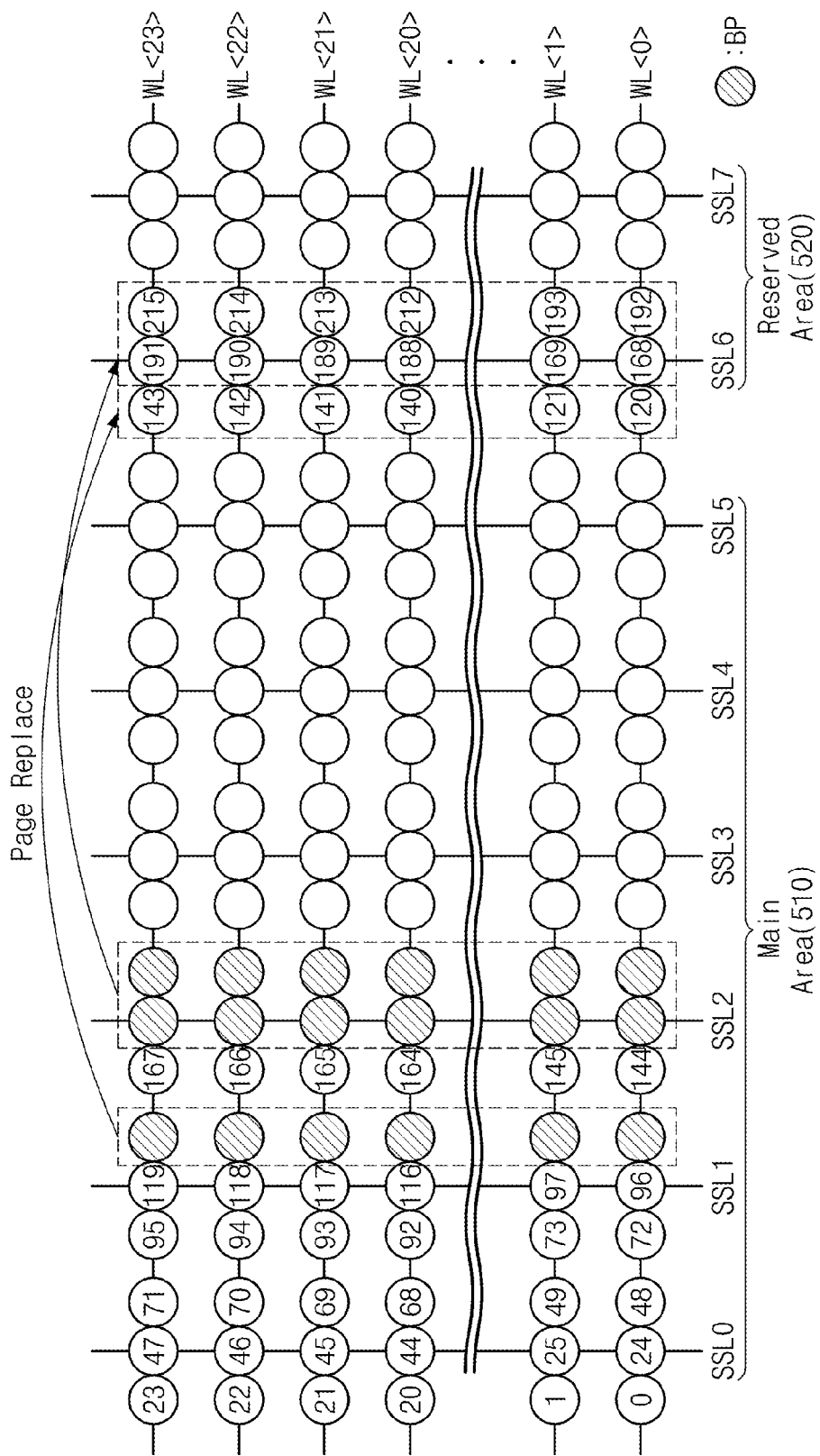
FIG. 11 is a diagram illustrating an embodiment that a memory block is repaired by a page unit.

FIG. 11 is a conceptual diagram illustrating an embodiment of the inventive concept wherein a memory block is repaired using a plurality of pages as a unit basis. Referring to FIG. 11, a plurality of bad pages of a main area 510 may be replaced with a plurality of pages of a reserved area 520.

Intersections of string selection lines SSL0 to SSL7 and word lines WL<0> to WL<23> may correspond to memory cells, respectively. Although not shown in FIG. 11, such a structure may be identically applied to bit lines BL0 to BLn−1. It is assumed that each memory cell is formed of a multi-level cell capable of storing 3-bit data. Three circles placed at each intersection may correspond to bits of corresponding logical pages, respectively. One circle may be a storage area corresponding to a page which is stored at a memory block. Addresses may be arranged sequentially by a page unit. However, the inventive concept is not limited thereto. Again, a program order may be determined regardless of an arrangement order of word lines or string selection lines.

At least one of logical pages (e.g., at least one of LSB, CSB, and MSB pages) associated with a main area 510 and corresponding to a string selection line SSLm (0≤m≤5) may be replaced with at least part of logical pages associated with a reserved area 520. For example, an MSB page formed of memory cells connected with a string selection line SSL1 may be replaced with an LSB page formed of memory cells connected with a string selection line SSL6. At an access to page addresses page 120 to page 143, an LSB page of the string selection line SSL6 may be selected.

CSB and MSB pages formed of memory cells connected with a string selection line SSL2 may be replaced with CSB and MSB pages formed of memory cells connected with the string selection line SSL6. For example, at an access to page addresses page 168 to page 191 and page 192 to page 215, CSB and MSB pages corresponding to the string selection line SSL6 may be selected. In other words, a logical page of the main area 510 may be replaced with a logical page of the reserved area 520.

A case wherein memory cells connected to a single bit line and being replaced by a page unit basis has been described. However, the inventive concept is not limited thereto. For example, the above-described repair method may be applied to each bit line, independently.

Figure 12:
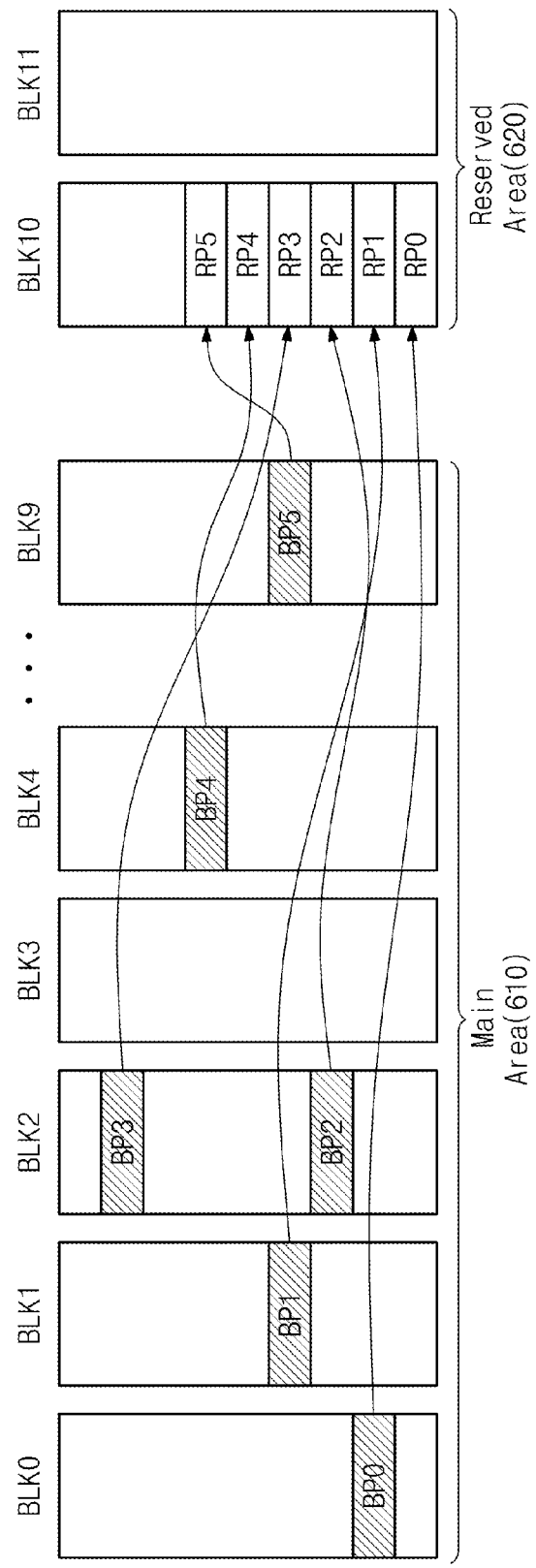
FIG. 12 is a conceptual diagram illustrating another embodiment of the inventive concept.

FIG. 12 is a conceptual diagram illustrating another embodiment of the inventive concept. Referring to FIG. 12, at least one memory block may be determined as a reserved area 620 to implement a repair operation being executed by a page unit.

Memory blocks BLK0 to BLK9 may constitute a main area 610, and memory blocks BLK10 and BLK11 may constitute a reserved area 620. In this case, a bad page BP0 of the memory block BLK0 may be replaced with a repair page RP0 of the memory block BLK10. A bad page BP1 of the memory block BLK1 may be replaced with a repair page RP1 of the memory block BLK10. Bad pages BP2 and BP3 of the memory block BLK2 may be replaced with repair pages RP2 and RP3 of the memory block BLK10. A bad page BP4 of the memory block BLK4 may be replaced with a repair page RP4 of the memory block BLK10. A bad page BP5 of the memory block BLK9 may be replaced with a repair page RP5 of the memory block BLK10.

Consistent with the above-described repair operation, the reserved area 620 may be formed of a memory block. A BP repair table 115' (refer to FIG. 1) may be configured to include block addresses and page addresses associated with bad pages and repair pages.

Figure 13:
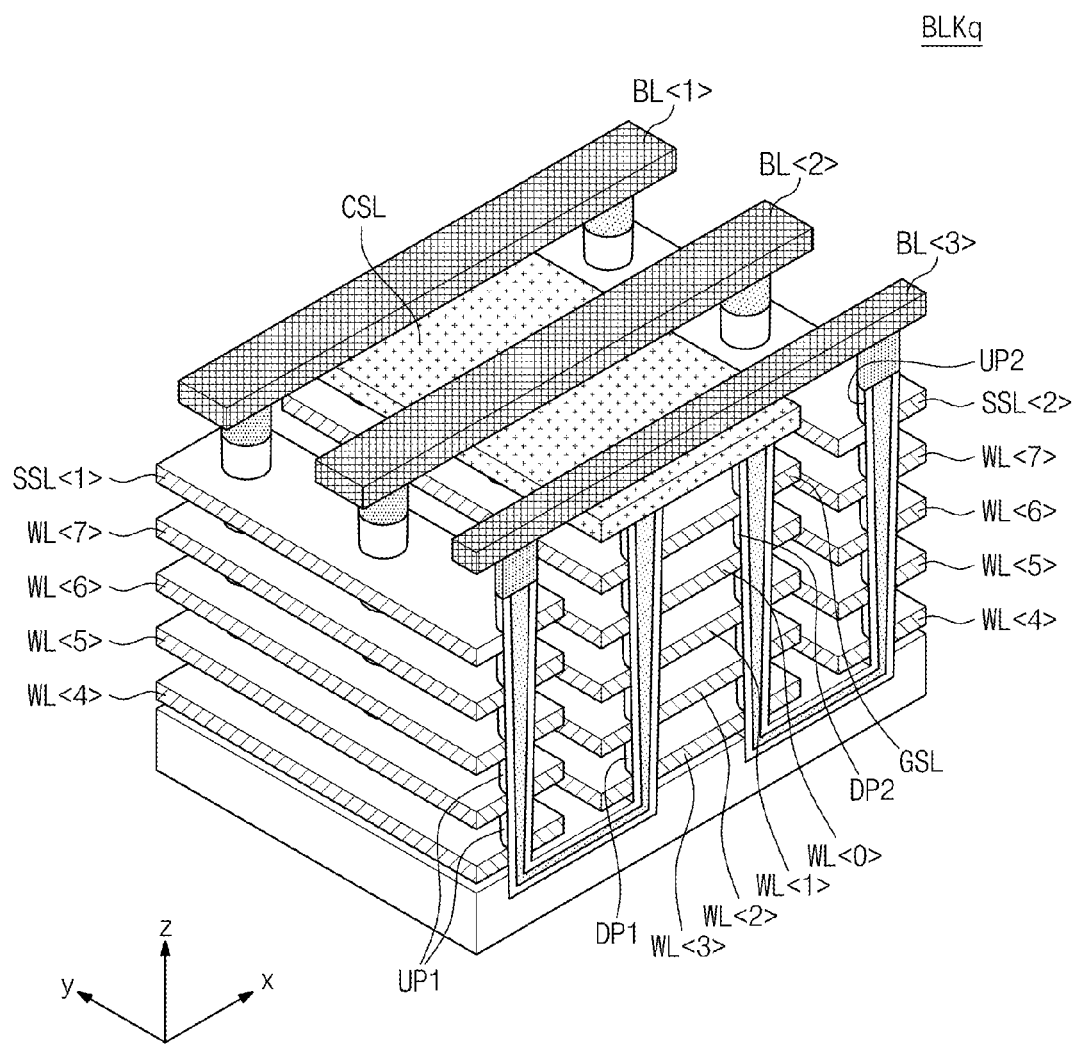
FIG. 13 is a perspective view of a nonvolatile memory device according to another embodiment of the inventive concept.

FIG. 13 is a perspective view further illustrating a nonvolatile memory device according to an embodiment of the inventive concept.

Referring to FIG. 13, word lines WL<4>, WL<5>, WL<6>, and WL<7> extending along a y-direction may be sequentially provided on a substrate 111 along a z-direction. The word lines WL<4>, WL<5>, WL<6>, and WL<7> may be spaced apart along the z-direction. First upper pillars UP1 may be disposed sequentially along the y-direction to penetrate the word lines WL<4>, WL<5>, WL<6>, and WL<7>. Herein, the word lines WL<4>, WL<5>, WL<6>, and WL<7> may be referred to as upper word lines.

On the substrate 101, word lines WL<0>, WL<1>, WL<2>, and WL<3> extending in the y-direction may be provided sequentially along the z-direction. The word lines WL<0>, WL<1>, WL<2>, and WL<3> may be spaced apart in the z-direction. First lower pillars DP1 may be disposed sequentially in the y-direction to penetrate the word lines WL<0>, WL<1>, WL<2>, and WL<3> in the z-direction. Second lower pillars DP2 may be disposed sequentially in the y-direction to penetrate the word lines WL<0>, WL<1>, WL<2>, and WL<3> in the z-direction. In example embodiments, the first lower pillars DP1 and the second lower pillars DP2 may be disposed in parallel along the z-direction. Herein, the word lines WL<0>, WL<1>, WL<2>, and WL<3> may be referred to as lower word lines.

On the substrate 111, the word lines WL<4>, WL<5>, WL<6>, and WL<7> extending along the y-direction may be sequentially provided along the z-direction. The word lines WL<4>, WL<5>, WL<6>, and WL<7> may be spaced apart along the z-direction. Second upper pillars UP2 may be disposed sequentially along the y-direction to penetrate the word lines WL<4>, WL<5>, WL<6>, and WL<7> along the z-direction.

A common source line CSL extending in the y-direction may be provided on the first and second lower pillars DP1 and DP2. In example embodiments, the common source line CSL may be n-type silicon. In example embodiments, in the event that the common source line CSL is formed of metal or a non-polar conductive material such as polysilicon, n-type sources may be additionally provided between the common source line CSL and the first and second lower pillars DP1 and DP2. In example embodiments, the common source line CSL and the first and second lower pillars DP1 and DP2 may be connected via contact plugs, respectively.

Drains 320 may be provided on the first and second upper pillars UP1 and UP2, respectively. In example embodiments, the drains 320 may be n-type silicon. On the drains 320, a plurality of bit lines BL<1> to BL<3> extending along the x-direction may be provided sequentially in the y-direction. In example embodiments, the bit lines BL<1> to BL<3> and the drains 320 may be connected via contact plugs.

Each of the first and second upper pillars UP1 and UP2 may include a surface layer and an inner layer. Each of the first and second lower pillars DP1 and DP2 may include a surface layer and an inner layer. The surface layers of the first and second upper pillars UP1 and UP2 and the first and second lower pillars DP1 and DP2 may include a blocking insulation film, a charge storage film, and a tunneling insulation film, respectively. The first upper pillars UP1 and the first lower pillars DP1 may be connected through first pipeline contacts PC1.

The first upper pillars UP1 and the word lines WL<4>, WL<5>, WL<6>, and WL<7> may form first upper strings, and the first lower pillars DP1 and the word lines WL<0>, WL<1>, WL<2>, and WL<3> may form first lower strings. The first upper strings may be connected with the first lower strings via the first pipeline contacts PC1, respectively. The drains 320 and the bit lines BL<1> to BL<3> may be connected with one ends of the first upper strings. The common source line CSL may be connected with one ends of the first lower strings. For example, the first upper strings and the first lower strings may form a plurality of strings connected between the bit lines BL<1> to BL<3> and the common source line CSL.

Likewise, the second upper pillars UP2 and the word lines WL<4>, WL<5>, WL<6>, and WL<7> may form second upper strings, and the second lower pillars DP2 and the word lines WL<0>, WL<1>, WL<2>, and WL<3> may form second lower strings. The second upper strings may be connected with the second lower strings via the second pipeline contacts PC2, respectively. The drains 320 and the bit lines BL<1> to BL<3> may be connected with one ends of the second upper strings. The common source line CSL is connected with one ends of the second lower strings. That is, the second upper strings and the second lower strings may form a plurality of strings connected between the bit lines BL<1> to BL<3> and the common source line CSL.

There is described the case that word lines WL<0>, WL<1>, WL<2>, and WL<3> are shared at adjacent lower pillars DP1 and DP2. However, when upper pillars adjacent to upper pillars UP1 and UP2 are added, the adjacent upper pillars may be configured to share the word lines WL<4>, WL<5>, WL<6>, and WL<7>.

Figure 14:
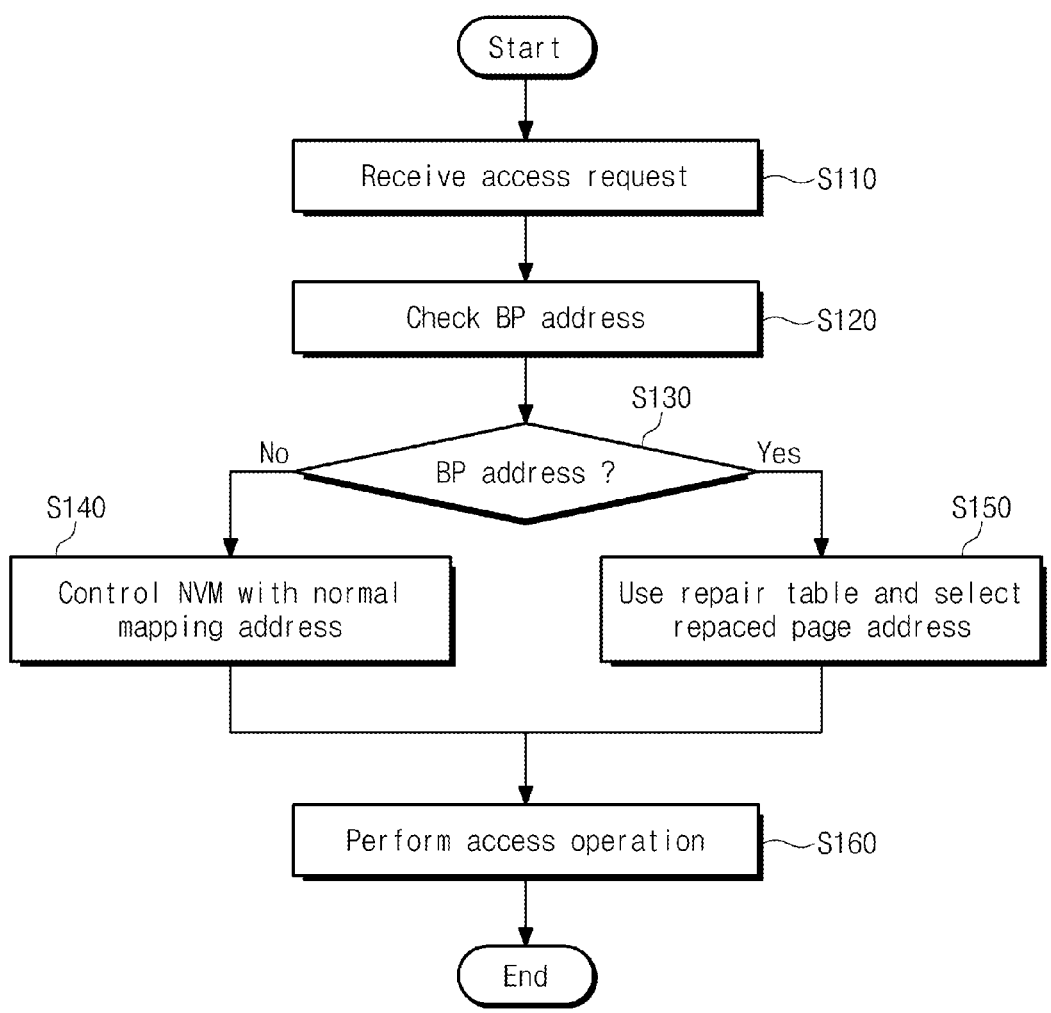
FIG. 14 is a flow chart summarizing an address mapping method for the storage device of FIG. 1.

FIG. 14 is a flow chart summarizing an address mapping method of the storage device 100 of FIG. 1. Referring to FIG. 14, when an input address corresponds to a bad page, a memory controller 110 may instead provide a repair address associated with a repair page to effectively replace the bad page.

The memory controller 110 receives a logical address as part of an access operation indicated by a host (S110). Mapping between logical addresses and physical addresses may be performed under the control of a flash translation layer (FTL). A mapping address ADD may be an address to which a repair on a bad page is not applied.

Then, the memory controller 110 may detect whether or not the input address corresponds to a bad page (S120). For example, the memory controller 110 may determine whether a selected page is a bad page or a normal page, based on information stored in the BP repair table 115' of FIG. 1.

If the selected page is determined to correspond to a normal page (S130=No), the method proceeds to operate the storage device and its constituent nonvolatile memory according to a normal address mapping scheme (S140). However, the selected page is determined to correspond to a bad page (S130=Yes), the method proceeds to operate the storage device and its constituent nonvolatile memory according to a replacement address mapping scheme (S150).

During the normal address mapping scheme, the memory controller 110 provides the nonvolatile memory device 120 with a physical address according to the conventional operation of the FTL, rather than with a repair address mapped according to the BP repair table 115' (S140). In certain embodiments, the mapping address provided by the FTL may be bypassed to the nonvolatile memory device 120. During the replacement address mapping scheme, the memory controller 110 provides the nonvolatile memory device 120 with an address essentially repairing the noted bad page by instead providing a repair address indicated by information stored in the BP repair table 115' (S150).

Following the provision of a competent physical address (i.e., one of S140 and S150), the memory controller 110 may access the nonvolatile memory device 120 (S160).

With the above-described access method, since a repair operation is capable of being performed on a page unit, it is possible to remarkably reduce the cost of repairing of a large-capacity nonvolatile memory device. In other words, the improvement of yield of a storage device 100 or a nonvolatile memory device 120 may be expected.

Figure 15:
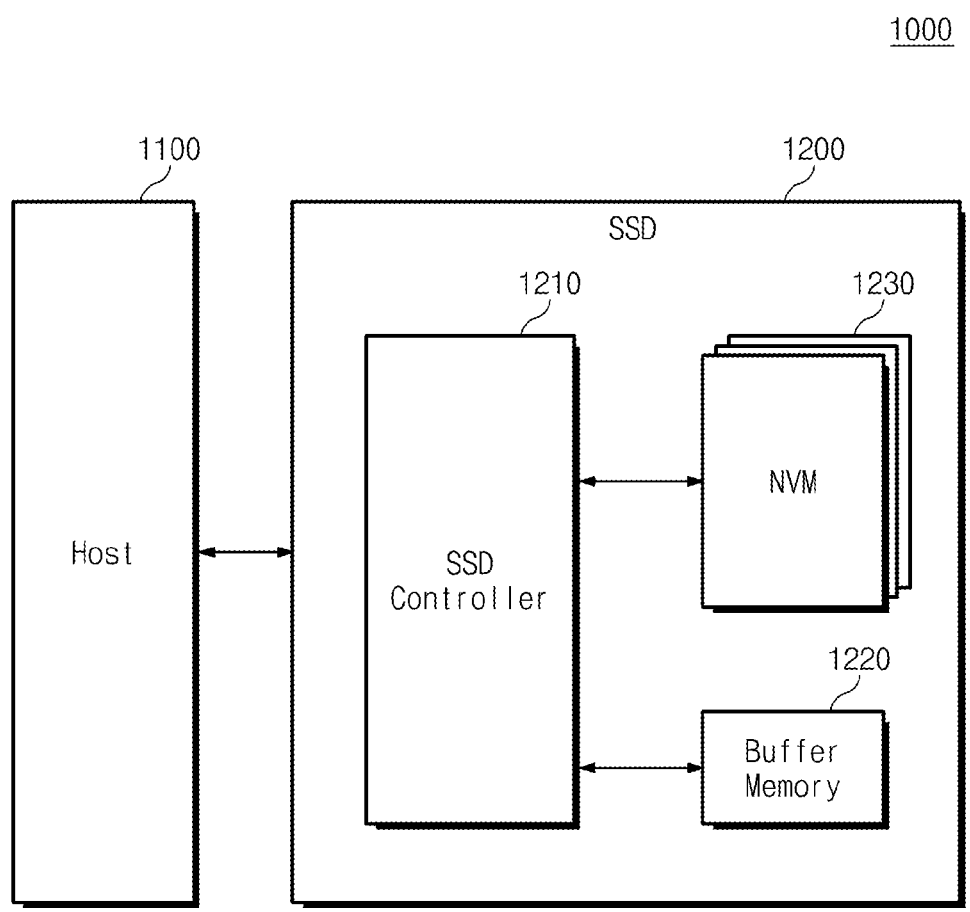
FIG. 15 is a block diagram illustrating a user device including a solid state drive according to an embodiment of the inventive concept.

FIG. 15 is a block diagram illustrating a user device including a solid state drive (SSD) according to an embodiment of the inventive concept. Referring to FIG. 15, a user device 1000 may include a host 1100 and a solid state drive (hereinafter, referred to as SSD) 1200. The SSD 1200 may include an SSD controller 1210, a buffer memory 1220, and a nonvolatile memory device 1230.

The SSD controller 1210 may provide physical interconnection between the host 1100 and the SSD 1200. The SSD controller 1210 may provide an interface with the SSD 1200 corresponding to a bus format of the host 1100. In particular, the SSD controller 1210 may decode a command provided from the host 1100, and may access the nonvolatile memory device 1230 according to the decoding result. The bus format of the host 1100 may include USB (Universal Serial Bus), SCSI (Small Computer System Interface), PCI express, ATA, PATA (Parallel ATA), SATA (Serial ATA), SAS (Serial Attached SCSI), and the like.

The buffer memory 1220 may temporarily store write data provided from the host 1100 or data read out from the nonvolatile memory device 1230. In the event that data existing in the nonvolatile memory device 1230 is cached, at a read request of the host 1100, the buffer memory 1220 may support a cache function to provide cached data directly to the host 1100. Typically, a data transfer speed of a bus format (e.g., SATA or SAS) of the host 1100 may be higher than that of a memory channel of the SSD 1200. That is, in the event that an interface speed of the host 1100 is remarkably fast, lowering of the performance due to a speed difference may be minimized by providing the buffer memory 1220 having a large storage capacity.

The buffer memory 1220 may be formed of a synchronous DRAM to provide sufficient buffering to the SSD 1200 used as an auxiliary mass storage device. However, the buffer memory 1220 is not limited to this disclosure.

The nonvolatile memory device 1230 may be provided as a storage medium of the SSD 1200. For example, the nonvolatile memory device 1230 may be formed of a vertical NAND flash memory device having a mass storage capacity. The nonvolatile memory device 1230 may be formed of a plurality of memory devices. In this case, the memory devices may be connected to the SSD controller 1210 by a channel unit, respectively. As a storage medium, the nonvolatile memory device 1230 may be formed of a NAND flash memory. However, the nonvolatile memory device 1230 is not limited to a NAND flash memory device. For example, a storage medium of the SSD 1200 can be formed of a PRAM, an MRAM, a ReRAM, a FRAM, a NOR flash memory, and the like. Further, the inventive concept may be applied to a memory system which uses different types of memory devices together. The nonvolatile memory device 1230 may be configured substantially the same as that described FIG. 3.

In the SSD 1200, the SSD controller 1210 may determine whether an input address is an address of a bad page. The SSD controller 1210 may remap an address corresponding to a bad page to a repair address for repairing the bad page by a page unit. The SSD controller 1210 may perform address remapping using a BP repair table.

Figure 16:
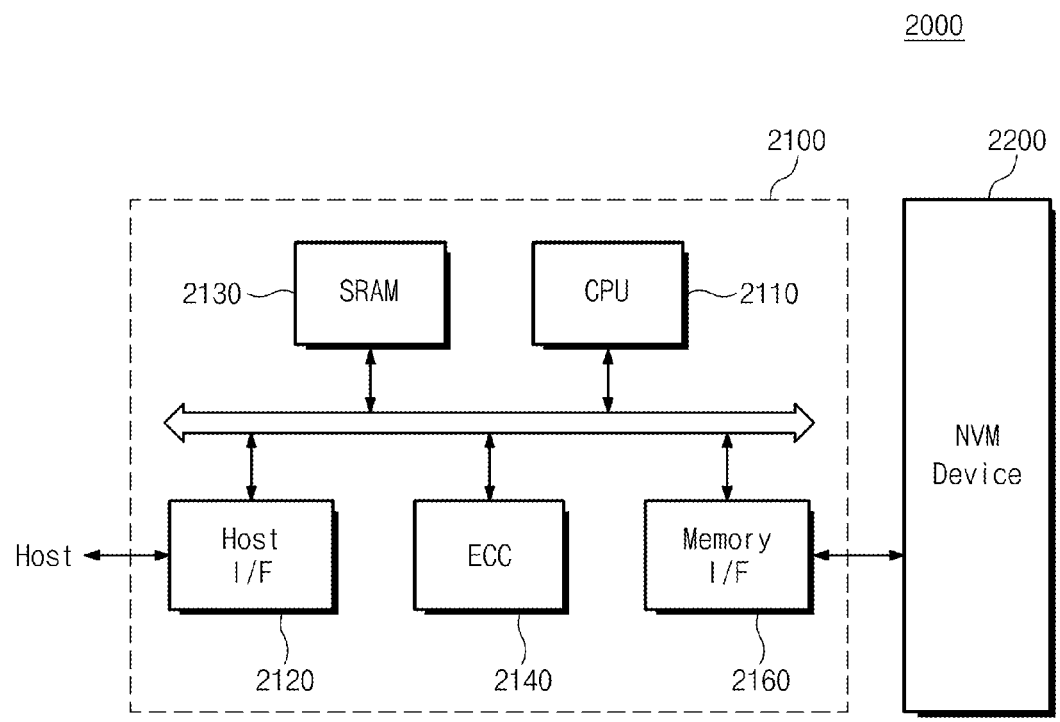
FIG. 16 is a block diagram illustrating a memory system according to another embodiment of the inventive concept.

FIG. 16 is a block diagram illustrating a memory system according to another embodiment of the inventive concept. Referring to FIG. 16, a memory system 2000 may include a memory controller 2100 and a nonvolatile memory device 2200.

The memory controller 2100 may be configured to control the nonvolatile memory device 2200. The memory card 2100 and the nonvolatile memory device 2200 may form a memory card. An SRAM 2130 may be used as a working memory of a CPU 2110. Herein, the SRAM 2110 may include a lookup table in which an update frequency on each page data is stored. A host interface 2120 may include a data exchange protocol of a host connected with the memory system 2000. An ECC block 2140 may be configured to detect and correct errors included in data read out from the nonvolatile memory device 2200. A memory interface 2160 may interface with the nonvolatile memory device 2200 according to an embodiment of the inventive concept. The CPU 2110 may execute an overall control operation for data exchange of the memory controller 2100. Although not shown in FIG. 16, the memory system 2000 may further include ROM which stores code data for interfacing with the host.

When an access is requested, the memory controller 2100 may determine whether an input address is an address of a bad page. The memory controller 2100 may remap an address corresponding to a bad page to a repair address for repairing the bad page by a page unit. The memory controller 2100 may perform address remapping using a BP repair table.

The nonvolatile memory device 2200 may be a multi-chip package including a plurality of flash memory chips. The memory system 2000 according to an embodiment of the inventive concept may be provided as a high-reliability storage medium in which the chance that errors are generated is low.

The memory controller 2100 may communicate with an external device (e.g., host) via one of interface protocols such as USB, MMC, PCI-E, SAS, SATA, PATA, SCSI, ESDI, IDE, and the like.

Figure 17:
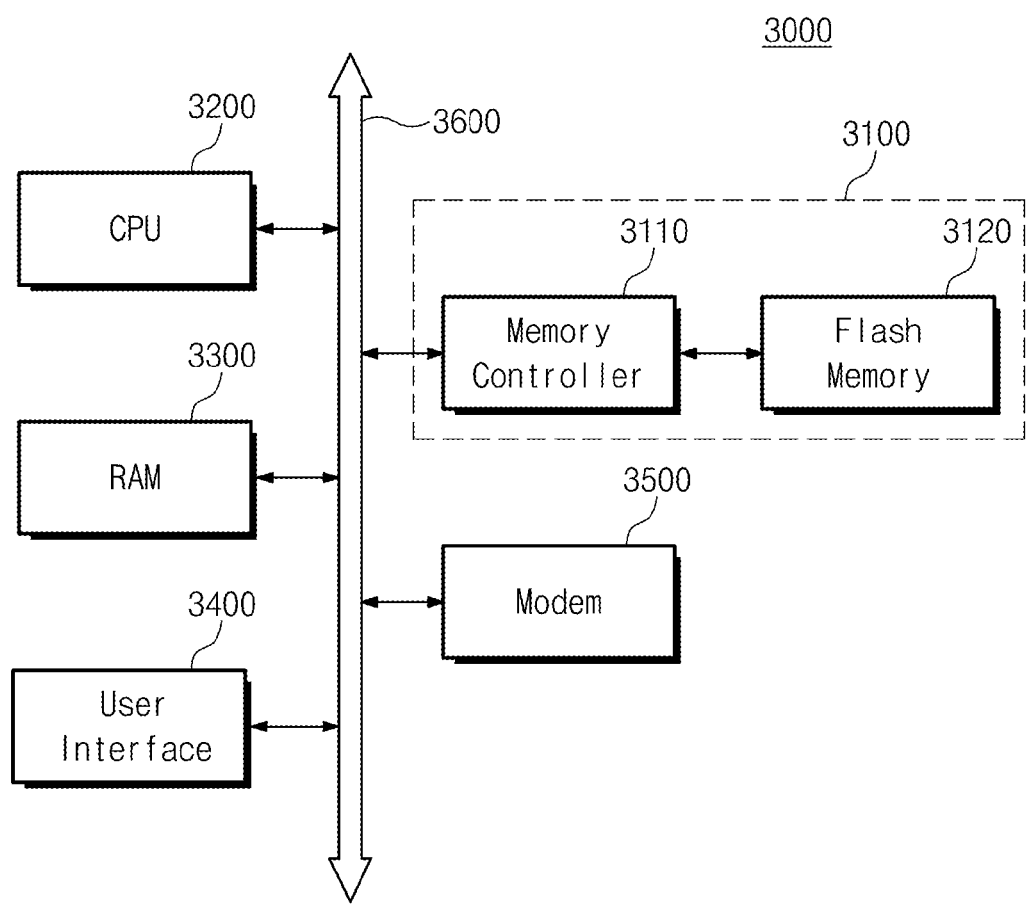
FIG. 17 is a block diagram illustrating a computing system including a flash memory device according to an embodiment of the inventive concept.

FIG. 17 is a block diagram illustrating a computing system including a flash memory device according to an embodiment of the inventive concept. A computing system 3000 may include a CPU 3200, a RAM 3300, a user interface 3400, a modem 3500 such as a baseband chipset, and a memory system 3100 which are electrically connected with a system bus 3600. The memory system 3100 may be configured substantially the same as an SSD in FIG. 15 or a memory card in FIG. 16.

If the computing system 3000 is a mobile device, it may further include a battery (not shown) which powers the computing system 3000. Although not shown in FIG. 17, the computing system 3000 may further include an application chipset, a camera image processor (CIS), a mobile DRAM, and the like. The memory system 3100 may be a solid state drive/disk (SSD) which uses a nonvolatile memory to store data. Alternatively, the memory system 3100 may be formed of a fusion flash memory (e.g., a One-NAND flash memory).

The memory controller 3100 may determine whether an input address is an address of a bad page. The memory controller 3100 may remap an address corresponding to a bad page to a repair address for repairing the bad page by a page unit. The memory controller 3100 may perform address remapping using a BP repair table.

A nonvolatile memory device and/or a memory controller may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and so on.

While the inventive concept has been described with reference to exemplary embodiments, it will be apparent to those skilled in the art that various changes and modifications may be made without departing from the scope of the following claims. Therefore, it should be understood that the above embodiments are not limiting, but illustrative.

What is claimed is:

1. A storage device comprising:
a nonvolatile memory device including a memory block, wherein memory cells of the memory block are arranged in pages and programmed according to a program order that is adjustable regardless of a physical arrangement of the memory cells in the memory block; and
a memory controller that controls page-by-page programming of the memory cells of the memory block by performing logical page address mapping such that a bad page of the memory block is replaced with a normal page of the memory block,
wherein the memory block has a three-dimensional (3D) structure in which the memory cells are stacked in a direction perpendicular to a substrate.

2. The storage device of claim 1, wherein the memory controller is configured to divide the memory block into a main area and a reserved area according to word lines of the memory block, and
the logical page address mapping includes remapping a received logical page address such that a bad page of the main area is replaced with a normal page of the reserved area.

3. The storage device of claim 2, wherein the received logical page address corresponds with a first page of memory cells in the memory block commonly connected to a first word line disposed in the main area, and a logical page address derived from the remapping of the received logical page address corresponds with a second page of memory cells in the memory block commonly connected to a second word line different from the first word line and disposed in the reserved area.

4. The storage device of claim 1, wherein the memory cells are multi-level memory cells.

5. The storage device of claim 1, wherein the memory controller is configured to divide the memory block into a main area and a reserved area according to selection lines of the memory block, and
the logical page address mapping includes remapping a received logical page address such that a bad page of the main area is replaced with a normal page of the reserved area.

6. The storage device of claim 5, wherein the received logical page address corresponds with a first page of memory cells in the memory block commonly connected to a first selection line disposed in the main area, and a logical page address derived from the remapping of the received logical page address corresponds with a second page of memory cells in the memory block commonly connected to a second selection line different from the first selection line and disposed in the reserved area.

7. The storage device of claim 1, wherein the memory controller reference a bad page repair table storing information controlling the logical page address mapping.

8. A storage device comprising:
a nonvolatile memory device including a plurality of memory blocks including a first memory block and a second memory block, each one of the plurality of memory blocks including memory cells that are programmed according to a program order that is variable regardless of an arrangement of the memory cells in each one of the plurality of memory blocks; and
a memory controller that controls the programming of the memory cells in the first memory block by performing logical page address mapping to replace a bad page of the first memory block with a normal page of the second memory block,
wherein the memory block has a three-dimensional (3D) structure in which the memory cells are stacked in a direction perpendicular to a substrate.

9. The storage device of claim 8, wherein memory cells included in the first memory block and the second memory block are multi-level cells configured to store at least two data bits.

10. The storage device of claim 9, wherein the bad page and the normal page correspond to at least one of a plurality of logical pages stored by the multi-level cells.

11. The storage device of claim 9, wherein a first logical page address corresponding to a first page of memory cells commonly connected to a first word line of the first memory block is addressed mapped onto a second logical page address corresponding to a second page of memory cells commonly connected to a second word line of the second memory block.

12. A storage device comprising:
- a nonvolatile memory device including a memory block having a three-dimensional (3D) structure in which memory cells are arranged in cell strings perpendicular to a laterally disposed substrate, wherein respective groups of the memory cells are arranged in respective pages by common connection to a same word line from among a plurality of word lines extending in parallel with the substrate;
- a bad page repair table; and
- a memory controller that controls page-by-page programming of the memory cells in the memory block with reference to the bad page repair table such that a bad page of the memory block is replaced with a normal page of the memory block, and the memory cells are programmed in the memory block according to a program order that is adjustable regardless of an arrangement of memory cells in the memory block.

13. The storage device of claim 12, wherein the memory controller stores the bad page repair table, and
- the bad page repair table uniquely correlates a bad page address for each bad page of the memory block with a repair page address indicating a normal page of the memory block replacing the bad page.

14. The storage device of claim 13, wherein the memory controller performs the address mapping by;
- receiving a first logical page address corresponding to a first page of memory cells in the memory block,
- comparing the first logical page address to bad page addresses stored in the bad page repair table, and
- upon matching the first logical page address with a first bad page address among the bad page addresses stored in the bad page repair table, mapping the first logical repair address to a second logical page address consistent with a first repair page address correlated in the bad page repair table with the first bad page address.

15. The storage device of claim 14, wherein the first logical page address corresponds to at least one page of multiple pages stored in a group of multi-level memory cells (MLC).

16. The storage device of claim 12, wherein memory block is logically divided by the memory controller into a main area and a reserved area,
- the logical division of the memory block being made according to a logical division of the plurality of word lines such that each one of the plurality of word lines is disposed in only one of the main area and the reserved area, such that a bad page of memory cells connected to a first word line in the main area is replaced with a normal page of memory cells connected to a second word line different from the first word line in the reserved area.

17. The storage device of claim 12, wherein the plurality of word lines includes N word lines, and
- $1^{st}$ through $N^{th}$ word lines of the N word lines are sequentially arranged in the 3D structure of the nonvolatile memory device such that $1^{st}$ through $K^{th}$ word lines disposed in the main area are closest to the substrate, and $(K+1)^{th}$ through $N^{th}$ wordlines disposed in the reserved area are separated from the substrate by the $1^{st}$ through $K^{th}$ word lines, where 'N' is a real number greater than 2 and 'K' is a real number less than N.

18. The storage device of claim 12, wherein memory cells are multi-level memory cells configured to store at least two data bits.

* * * * *